(12) United States Patent
Hirano et al.

(10) Patent No.: US 7,400,512 B2
(45) Date of Patent: Jul. 15, 2008

(54) MODULE INCORPORATING A CAPACITOR, METHOD FOR MANUFACTURING THE SAME, AND CAPACITOR USED THEREFOR

(75) Inventors: Koichi Hirano, Osaka (JP); Tsunenori Yoshida, Kyoto (JP); Seiichi Nakatani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/945,552

(22) Filed: Nov. 27, 2007

(65) Prior Publication Data

US 2008/0089043 A1    Apr. 17, 2008

Related U.S. Application Data

(62) Division of application No. 10/944,311, filed on Sep. 17, 2004, now Pat. No. 7,319,599.

(30) Foreign Application Priority Data

Oct. 1, 2003   (JP)   ............... 2003-343588

(51) Int. Cl.
*H05K 1/18*   (2006.01)
(52) U.S. Cl. ............... 361/763; 361/766; 361/780; 361/784; 361/803; 361/523; 174/259; 174/260; 174/261; 174/262; 257/690; 257/691; 257/692
(58) Field of Classification Search ............... 361/679, 361/760–766, 780–784, 792–795, 803, 510, 361/523–533; 174/255–262; 257/690–692; 333/174, 184, 185
See application file for complete search history.

(56) References Cited

U.S. PATENT DOCUMENTS

| | | | |
|---|---|---|---|
| 3,357,434 A | 12/1967 | Abell | |
| 4,747,013 A | 5/1988 | Dexel et al. | |
| 4,788,624 A | 11/1988 | Strange | |
| 5,223,120 A | 6/1993 | Kojima et al. | |
| 5,225,969 A | 7/1993 | Takaya et al. | |
| 5,365,144 A | 11/1994 | Layh | |
| 5,444,223 A | 8/1995 | Blama | |

(Continued)

FOREIGN PATENT DOCUMENTS

JP   4-179199   6/1992

(Continued)

*Primary Examiner*—Dean A. Reichard
*Assistant Examiner*—Xiaoliang Chen
(74) *Attorney, Agent, or Firm*—Hamre, Schumann, Mueller & Larson, P.C.

(57) ABSTRACT

A module incorporating a capacitor, the module including a circuit board and a layer incorporating a capacitor, wherein the circuit board includes a wiring layer and a via contact for providing electrical conductivity to a cathode and an anode of the capacitor. The layer incorporating the capacitor includes a ferromagnetic layer integrated with at least a portion of a surface of the capacitor, and in the circuit board or the layer incorporating the capacitor a coil is wound around the capacitor, or an inductor component is disposed in parallel with the capacitor. Accordingly, a module incorporating a capacitor in which miniaturization, a higher density and a reduced thickness have been achieved, as well as a method for producing the module and a capacitor used for the module, are provided.

11 Claims, 8 Drawing Sheets

U.S. PATENT DOCUMENTS

| | | |
|---|---|---|
| 6,038,133 A | 3/2000 | Nakatani et al. |
| 6,148,500 A | 11/2000 | Krone et al. |
| 6,343,005 B1 | 1/2002 | Tadanobu et al. |
| 6,346,865 B1 | 2/2002 | Callewaert et al. |
| 6,400,556 B1 | 6/2002 | Masuda et al. |
| 6,504,705 B2 | 1/2003 | Shimada et al. |
| 7,002,435 B2 | 2/2006 | Mishima et al. |
| 7,126,811 B2 | 10/2006 | Hirano et al. |
| 7,319,599 B2 * | 1/2008 | Hirano et al. ............ 361/763 |
| 2002/0075633 A1 | 6/2002 | Shimada et al. |
| 2004/0105218 A1 | 6/2004 | Masuda et al. |
| 2004/0113741 A1 | 6/2004 | Li et al. |
| 2004/0125543 A1 | 7/2004 | Hirano et al. |
| 2004/0231119 A1 | 11/2004 | Brennenman et al. |

FOREIGN PATENT DOCUMENTS

| | | |
|---|---|---|
| JP | 6-168855 | 6/1994 |
| JP | 9-181433 | 7/1997 |
| JP | 11-220262 | 8/1999 |
| JP | 2002-198264 | 7/2002 |

* cited by examiner

MODULE INCORPORATING A CAPACITOR, METHOD FOR MANUFACTURING THE SAME, AND CAPACITOR USED THEREFOR

CROSS-REFERENCE TO RELATED APPLICATIONS

This application is a Division of application Ser. No. 10/944,311, filed Sep. 17, 2004, which application is incorporated herein by reference.

BACKGROUND OF THE INVENTION

1. Field of the Invention

The present invention relates to modules incorporating a capacitor, methods for manufacturing the same, and capacitors used therefor.

2. Description of the Related Art

In recent years, with the progress in the miniaturization of various devices and the increase in density of capacitors constituting the devices, there is an increasing demand for the miniaturization of the capacitor itself. Moreover, with the development of higher speed devices, high-speed response and low-loss properties are demanded for capacitors equipped with a capacitor unit. In order to meet these demands, three-dimensional modules incorporating a capacitor in which a capacitor or a semiconductor component (active component) provided with a capacitor is incorporated in a substrate have been developed vigorously (see e.g., JP H11-220262A).

At this time, in order to attain both a higher density and a reduced thickness for capacitors constituting a module incorporating a capacitor, it is necessary to use a high-performance capacitor whose size and thickness are small. However, as the size and the thickness of the capacitors become increasingly small, the handling and the mounting of the capacitors have become particularly difficult.

When the capacitor unit is a capacitor, a film-type solid electrolytic capacitor is suitable as a capacitor to be incorporated in a substrate for producing a small or thin module incorporating a capacitor. However, the film-type solid electrolytic capacitor is particularly difficult to handle as a single component, since it is extremely thin although having a large capacitance.

Here, a conventional film-type solid electrolytic capacitor is described with reference to FIG. 12. FIG. 12 is a cross-sectional view showing the configuration of a typical conventional film-type solid electrolytic capacitor. The conventional film-type solid electrolytic capacitor shown in FIG. 12 is provided with: an anode valve metal 121, such as aluminum; a dielectric as a solid electrolyte, and is formed on a portion of the surface of the dielectric oxide film 122; and a cathode current collector layer 124, such as a carbon layer or an Ag (silver) paste layer, formed on the surface of the solid electrolyte layer 123; and an insulating resin portion 125 formed on a portion of the surface of the dielectric oxide film 122 (see e.g., pars. [0003] and [0004] and FIG. 11 of JP2002-198264A). It should be noted that in the conventional film-type solid electrolytic capacitor shown in FIG. 12, the insulation between the anode valve metal 121 and the cathode current collector 124 is ensured by providing the insulating resin portion 125.

Since such a film-type solid electrolytic capacitor generally has a thickness of 0.2 mm or less, it tends to be deformed by an external force and physically damaged. Therefore, instead of handling the film-type solid electrolytic capacitor as a single component, a plurality of the film-type capacitors are enclosed in a package to form a chip, thus preventing deformation or damage, while allowing them to be handled readily by suction utilizing an air pressure difference (see e.g., FIGS. 1 and 3 of JP H6-168855A).

Usually, when a capacitor is mounted using a mounting device such as a chip mounter, the capacitor is first held (by vacuum suction) by a transport member with an air pressure difference, then moved to a desired position on a substrate, with the capacitor held by the transport member, followed by separating the capacitor from the transport member by suspending the vacuum suction. Therefore, it has been difficult to mount on a substrate a single conventional capacitor unit, which is small and has weak mechanical strength, as a single component.

In the case of the film-type solid electrolytic capacitor, it has been particularly difficult to handle the capacitor as a single component, since it is small and very thin, with its thickness being 0.2 mm or less. Furthermore, when such a film-type solid electrolytic capacitor is mounted onto a substrate as a single component, the functions of the capacitor may be damaged fatally by, for example, peeling of the surface layer. Moreover, the surface layer is not flat, so that a sufficient suction force may not be obtained by vacuum suction and a suction failure or falling thus may occur during transporting the capacitor. Therefore, it has been extremely difficult to perform a conventional automatic mounting.

On the other hand, a conventional capacitor formed as a chip by enclosing a plurality of capacitors in a package can be handled more easily, than a capacitor as a single component. However, in this case, the capacitor becomes large physically, and a plurality of capacitor units are concentrated on the same portion on the substrate, hindering the flexibility of the circuit design. This results in the necessity to provide a more complex or longer wiring. Furthermore, when the conventional capacitor formed as a chip is embedded in a multi-layered circuit board, it is necessary to provide an insulating layer of a thickness corresponding to the height of the capacitor. Therefore, in the case of using the conventional capacitor formed as a chip, it has been difficult to realize a further reduction in the size and the thickness of a module incorporating a capacitor.

SUMMARY OF THE INVENTION

Therefore, in order to solve the above-described conventional problems, the present invention provides a module incorporating a capacitor capable of realizing miniaturization, a higher density and a reduced thickness and a method for producing the same, as well as a capacitor used for such a module.

A module incorporating a capacitor according to the present invention is a module incorporating a capacitor, the module including a circuit board and a layer incorporating a capacitor, wherein the circuit board includes a wiring layer and a via contact for providing electrical conductivity to a cathode and an anode of the capacitor, wherein the layer incorporating the capacitor includes a ferromagnetic layer integrated with at least a portion of a surface of the capacitor. In the circuit board or the layer incorporating the capacitor, a coil is wound around the capacitor, or an inductor component is disposed in parallel with the capacitor.

A method for producing a module incorporating a capacitor according to the present invention is a method for producing a module incorporating a capacitor, the module including a circuit board, a layer incorporating a capacitor integrated with the circuit board and a ferromagnetic layer integrated with at least a portion of a surface of the capacitor, the method comprising: transporting the capacitor to a circuit board including a first wiring layer on a surface thereof by a magnetic action, followed by mounting the capacitor onto the circuit board; and placing an electrically insulating substrate and a second circuit board including a second wiring layer in this order from the capacitor side of the circuit board, followed by embedding the capacitor in the electrically insulating substrate by heating and pressing. In one of the steps, a coil is wound around the capacitor, or an inductor component is disposed in parallel with the capacitor in the circuit board or the layer incorporating the capacitor.

A capacitor according to the present invention is a capacitor used for a module incorporating a capacitor, the module including a circuit board and a layer incorporating a capacitor, wherein a ferromagnetic layer is integrated with at least a portion of a surface of the capacitor.

DESCRIPTION OF THE PREFERRED EMBODIMENTS

Figure 1A:
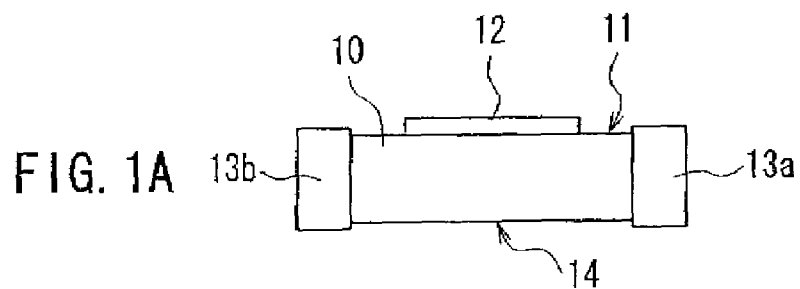
FIG. 1A is a schematic side view of a capacitor according to Embodiment 1 of the present invention.

In the present invention, "ferromagnetic material" refers to a substance whose constituent atoms each has a magnetic moment and are aligned in the same direction and that is magnetized in that direction when a magnetic field is applied and exhibits residual magnetization even after the magnetic field is removed. Any ferromagnetic material changes into a paramagnetic material when its temperature is increased, and the temperature at which this change takes place is called the Curie point. In the present invention, it is preferable to use a ferromagnetic material that exhibits ferromagnetism in the actual operating temperature range, including, for example, from room temperature (20° C.) to about 150° C. or lower. It is more preferred to use a soft magnetic material as a ferromagnetic material. It is preferable that the ferromagnetic material used in the present invention ensures sufficient performance of an inductor formed in the module, and has a saturation flux density per capacitor of at least 10 mT (milli Tesla), in view of the suction and the like performed during mounting of components.

A capacitor according to the present invention is provided with a ferromagnetic portion. More specifically, a capacitor of the present invention may be a capacitor (hereinafter, also referred to as "capacitor A") formed by integrating a ferromagnetic portion with a capacitor unit by, for example, bonding, or a capacitor (hereinafter, also referred to as "capacitor B") formed by providing a ferromagnetic portion at least on a portion of the components that are necessary to form a capacitor unit. Alternatively, a capacitor of the present invention may be a combination of these two configurations. It is to be noted that the "integration" as used herein means bonding a ferromagnetic material to a portion of a capacitor or providing a ferromagnetic portion at least on a portion of the components that are necessary to form a capacitor unit.

With these configurations, the ferromagnetic portion serves as a magnetic core and also serves as a magnet in the presence of an external magnetic field, so that the capacitor can be transported by a magnetic action. More specifically, it is possible to reliably perform a transport operation including: causing the capacitor to be attracted by an electromagnet by a magnetic attraction; moving the capacitor to a desired position by moving the electromagnet; and separating the capacitor from the electromagnet by eliminating an external magnetic field generated by the electromagnet.

With these configurations, even a capacitor including only a single capacitor unit, which is highly flexible as a single component and whose surface is very rough or in an asymmetrical shape, can be transported more easily and reliably, than a conventional suction (vacuum suction) using an air pressure difference. Furthermore, the use of a mounter capable of mounting circuit components with a magnetic action makes it possible to mount a capacitor including a single capacitor unit onto a substrate, and to realize automatic mounting of the capacitor.

It is preferable that a capacitor according to the present invention is of the surface mount type, from the viewpoint of performing mounting with a magnetic action, particularly automatic mounting. In addition, a capacitor of the present invention further may include, for example, an insulating protective film for ensuring the electrical insulation from the outside and a protective film for reducing the damage caused by an external force.

For example, the capacitor A of the present invention may have a configuration in which the ferromagnetic portion is a ferromagnetic foil bonded onto a capacitor unit (hereinafter, also referred to as "foil-type ferromagnetic portion"), or a configuration in which the ferromagnetic portion includes a resin composition formed on a capacitor unit and a plurality of ferromagnetic particles dispersed and fixed in the resin composition (hereinafter, also referred to as "particle-dispersed ferromagnetic portion").

Preferably, the ferromagnetic portion is disposed in the vicinity of the surface of the capacitor and more preferably, it is exposed on the surface of the capacitor. The reason is that the closer the ferromagnetic portion is to the surface, the stronger its attracting force to an external magnet. In the case of a capacitor whose mounting surface, which is the surface placed on the substrate side, is previously determined, it is preferable that the ferromagnetic portion is disposed on a surface different from the mounting surface. Further, when the capacitor unit has a substantially rectangular solid shape, it is more preferable that the ferromagnetic portion is disposed on a surface opposite to the mounting surface.

Examples of the ferromagnetic material forming the ferromagnetic portion include: ferromagnetic metals such as Fe, Ni and Co; ferromagnetic alloys including a plurality of different ferromagnetic metals; and ferromagnetic compounds including a ferromagnetic metal. Examples of the ferromagnetic alloys include an iron-nickel (Fe—Ni) alloy, and examples of the ferromagnetic compounds include a ferrite.

When the ferromagnetic portion is the foil-type ferromagnetic portion, the capacitor A of the present invention may have a configuration in which the ferromagnetic foil is fixed onto the capacitor unit via an adhesive. Alternatively, it may have a configuration in which the ferromagnetic foil is fixed directly onto the capacitor unit, without disposing any other member between the ferromagnetic foil and the capacitor unit. The capacitor A of the present invention also can be provided by bonding the ferromagnetic foil to an existing capacitor unit. Examples of the ferromagnetic foil include a foil composed only of a ferromagnetic material (e.g., an iron foil, a nickel foil, a cobalt foil, an iron-nickel foil and a ferrite foil), and a foil containing a ferromagnetic material as the main component (e.g., an iron-silicon foil, an iron-aluminum-silicon foil, an iron-boron foil and a cobalt-boron foil). Here, "main component" means a component that constitutes at least 50 mass % and less than 100 mass % of the ferromagnetic foil. Preferably, the ferromagnetic foil has a thickness in the range of 5 μm to 100 μm.

When the ferromagnetic portion is the particle-dispersed ferromagnetic portion, the resin composition serves as an adhesive, so that the ferromagnetic particles can be fixed onto the capacitor unit without using an adhesive separately. In addition, the capacitor A of the present invention may have a configuration in which a sheet member including a resin composition and ferromagnetic particles is used as the ferromagnetic portion, and the sheet member is bonded to the capacitor unit. When the ferromagnetic portion is the particle-dispersed ferromagnetic portion, the ferromagnetic portion can be shaped easily, so that a ferromagnetic portion with a desired shape can be formed easily.

The particle-dispersed ferromagnetic portion may include only one kind of ferromagnetic particles, or may include a plurality of different kinds of ferromagnetic particles. Examples of the ferromagnetic particles included in the particle-dispersed ferromagnetic portion include particles composed only of ferromagnetic materials (e.g., iron particles, nickel particles, cobalt particles, iron-nickel alloy particles and ferrite particles) and particles containing ferromagnetic materials as the main component (e.g., iron-silicon particles, iron-aluminum particles, iron-boron particles and cobalt-boron particles). Here, "main component" means a component that constitutes at least 50 mass % and less than 100 mass % of the constituents of the particles. The ferromagnetic particles preferably have an average particle size of at least 0.01 μm and at most 50 μm, and more preferably at least 1 μm and at most 30 μm.

As the resin serving as a binder for the ferromagnetic particles, it is preferable to use a thermosetting resin. In this case, the ferromagnetic particles are firmly fixed onto the capacitor unit by curing the thermosetting resin.

It is preferable that the above-described thermosetting resin is at least one selected from the group consisting of an epoxy resin, a polyimide resin, a polyphenylene ether resin, a phenol resin, a fluorocarbon resin and an isocyanate resin. Preferably, the mixing ratio of the ferromagnetic particles and the thermosetting resin is such that the mixing proportion of the ferromagnetic particles is in the range of 85 mass % to 98 mass %, based upon the total mass taken as 100 mass %. Preferably, the mixture of the ferromagnetic particles and the thermosetting resin is in the form of a sheet. and the thickness of the sheet after curing is in the range of 5 μm to 100 μm.

The capacitor A has a structure in which the ferromagnetic portion prevents the occurrence of positional or rotational shift of the capacitor when the capacitor is mounted onto an external substrate. More specifically, it is preferable that the surface of the ferromagnetic portion that is located opposite to the capacitor unit has a substantially concave polygonal outline. With this configuration, it is possible to prevent the occurrence of positional or rotational shift more favorably than a configuration in which the surface has a circular or convex polygonal outline. Here, the substantially concave polygonal shape includes, for example, a concave polygon and a shape in which at least a portion of the sides forming a concave polygon is replaced by a curved line. In addition, "convex polygon" means a polygon in which all interior angles are less than 180°, and "concave polygon" means a polygon in which at least one interior angle is greater than 180°. "Rotational shift" means a shift resulting from the rotational movement of the capacitor, and "positional shift" means a shift resulting from the parallel movement of the capacitor. Examples of the concave polygonal shape include a cross-shape, a T-shape and a U-shape. It should be noted that the surface outline of the ferromagnetic portion is not limited to a substantially concave polygonal shape. In addition, it is preferable that the location of the ferromagnetic portion is determined taking into account the center of gravity of the capacitor. Preferably, the ferromagnetic portion is disposed such that the center of gravity of the capacitor and that of the ferromagnetic are aligned on a vertical line.

With a structure in which the ferromagnetic portion prevents rotational or positional shift, the rotational or positional shift of the capacitor during attracting the capacitor to a transport member (electromagnet) can be corrected with a magnetic force, by shaping the surface of the attracting side of the transport member correspondingly to the shape of the surface outline of the ferromagnetic portion. As a result, the positional accuracy during attracting is improved. Therefore, the positional accuracy at the time of transporting the capacitor to a desired position generally depends solely on the positional accuracy of movement of the transport member (electromagnet), so that the transporting can be performed with an extremely high accuracy. In the case of mounting the capacitor with a high density, the positional accuracy in placing the capacitor is important. A capacitor having this configuration can reduce margins because of its high positional accuracy. This facilitates an increase of the density of the capacitor. To improve the positional accuracy during attracting, it is preferable, for example, to arrange a low friction, non-magnetic material on the surface of the transport member. The reason is that the positional accuracy easily can be corrected with a magnetic force. Examples of the low friction, non-magnetic material include non-magnetic metals such as copper, silver and gold, and resins such as polytetrafluoroethylene. Alternatively a low friction layer made of these low friction, non-magnetic materials may be formed on the ferromagnetic portion.

The capacitor A has a configuration in which the capacitor unit is an electrolytic capacitor including: a valve metal including a capacitance forming portion and an electrode lead portion; a dielectric oxide film disposed on the surface of the valve metal; a solid electrolyte disposed on the surface of the capacitance forming portion, with the dielectric oxide film interposed between the solid electrolyte and the capacitance forming portion; and a current collector that is formed on the surface of the solid electrolyte and is electrically insulated from the valve metal, and a ferromagnetic portion is disposed on the current collector. With this configuration, an electrolytic capacitor, which is most difficult to be transported as a single component among various capacitor units, can be handled easily as a single component.

In the following, a method for producing the capacitor is described. According to a first method for producing a capacitor as described above, it is possible to produce a capacitor A including a foil-type ferromagnetic portion bonded to a capacitor unit as a ferromagnetic portion. In a step of working a ferromagnetic foil into a predetermined shape, the ferromagnetic foil can be worked into a predetermined shape by, for example, cutting or punching. In a step of bonding a ferromagnetic portion, the ferromagnetic foil can be bonded to the capacitor unit with a liquid or paste adhesive, or an adhesive sheet. It is possible to employ either a method of bonding the ferromagnetic foil to the capacitor unit after depositing the adhesive or the adhesive sheet to the ferromagnetic foil, or a method of bonding the ferromagnetic foil to the capacitor unit after depositing the adhesive or the adhesive sheet to the capacitor unit.

Furthermore, according to a second method for producing a capacitor as described above, it is possible to produce a capacitor A including a particle-dispersed ferromagnetic portion as a ferromagnetic portion. In a step of depositing a paste mixture, the paste mixture can be deposited by an application process, or a printing process such as screen printing, for example. In a step of curing the paste mixture, the paste mixture can be cured by a heating process using a heat source, or by a heating process using light irradiation.

The first or second method for producing a capacitor A further includes a step of forming a capacitor unit, and the step of forming a capacitor unit includes a step of forming a dielectric oxide film on the surface of a valve metal, a step of forming a solid electrolyte on a portion of the surface of the dielectric oxide film and a step of forming a current collector on the surface of the solid electrolyte. With this configuration, it is possible to produce a capacitor A including an electrolytic capacitor as a capacitor unit.

According to a third method for producing a capacitor as described above, it is possible to produce a capacitor A including an electrolytic capacitor as a capacitor unit and a foil-type ferromagnetic portion fixed directly to the capacitor unit. This production method eliminates the need to deposit the adhesive or the adhesive sheet on the foil-type ferromagnetic portion, thus simplifying the production process.

The capacitor B has, for example, a configuration in which a capacitor unit includes a resin composition, and the ferromagnetic portion is formed by a plurality of particles dispersed and fixed in the resin composition. With this configuration, the ferromagnetic portion possesses ferromagnetism without fail, so that it is possible to reliably perform a transport operation including: causing the capacitor to be attracted by an electromagnet with a magnetic attraction, moving the capacitor to a desired position by moving the electromagnet; and separating the capacitor from the electromagnet by eliminating an external magnetic field generated by the electromagnet, as in the case of the above-described capacitor A. Furthermore, it is possible to form the resin composition, as well as to fix the ferromagnetic portion.

As the ferromagnetic particles forming the ferromagnetic portion of the capacitor B, it is possible to use the same ferromagnetic particles as those of the above described capacitor A.

The capacitor B has a configuration in which the capacitor unit is an electrolytic capacitor including: a valve metal including a capacitance forming portion and an electrode lead portion; a dielectric oxide film disposed on the surface of the valve metal; a solid electrolyte disposed on the surface of the capacitance forming portion, with the dielectric oxide film interposed between the solid electrolyte and the capacitance forming portion; and a current collector that is disposed on the surface of the solid electrolyte and is electrically insulated from the valve metal, wherein the current collector of the electrolytic capacitor is a resin component. With this configuration, even in the case of an electrolytic capacitor component, which is most difficult to be transported as a single component among various capacitor units, the capacitor unit can be handled easily as a single component.

Next, according to a fourth method for producing a capacitor as described above, it is possible to produce a capacitor B including an electrolytic capacitor as a capacitor unit, wherein a ferromagnetic portion is formed on the current collector of the electrolytic capacitor. With this configuration, the ferromagnetic portion is not disposed on the capacitor unit, unlike the capacitor A, and it is possible to produce a capacitor with an even smaller thickness. Furthermore, since it is not necessary to dispose the ferromagnetic portion on the capacitor unit, the production process can be simplified, as compared with the capacitor A.

In the following, a module incorporating a capacitor according to the present invention is described. The module incorporating a capacitor includes a ferromagnetic layer integrated with at least a portion of one of the surfaces of the capacitor. In the circuit board or the capacitor-incorporating layer of the module, a coil surrounding the capacitor is disposed, or an inductor component is disposed in parallel with the capacitor, so that the module incorporating a capacitor has achieved miniaturization, a higher density and a reduced thickness. That is, each single capacitor unit can be embedded in an insulating layer in a multi-layered circuit board, making it possible to reduce the thickness of the module incorporating a capacitor, and to increase the density of the capacitor incorporated in the module incorporating a capacitor.

Together with a capacitor, the module incorporating a capacitor of the present invention may incorporate a passive device such as a resistor or a coil, or may incorporate an active device (e.g., a semiconductor device, a semiconductor package, a crystal oscillator and a surface acoustic wave (SAW) filter). In this specification, "interlayer contact" includes, for example, a via contact that electrically connects two adjacent wiring layers, a contact that penetrates a plurality of electrically insulating layers and connects wiring layers that are separated from each other by at least one layer and a through hole contact formed on the side wall of a through hole penetrating the capacitor-incorporating layer.

The module incorporating a capacitor of the present invention includes a capacitor unit and a ferromagnetic portion disposed on the capacitor unit, and the ferromagnetic portion is disposed on a surface of the capacitor unit that is different from the surface facing the above-described first wiring layer. With this configuration, the capacitor can be mounted with high positional accuracy with a magnetic action, thus providing a high-performance substrate incorporating a capacitor unit that does not cause disconnection of wiring. Preferably, the ferromagnetic portion is formed on a surface of the capacitor that is opposite to the mounting surface. In this case, the capacitor can be transported with a smaller magnetic force than the case where the ferromagnetic portion is formed on the surface (mounting surface) facing the first wiring layer at the time of mounting of the capacitor, so that it is also possible to reduce the harmful effect of the magnetic force applied to other capacitors.

The module incorporating a capacitor of the present invention includes a capacitor unit and a ferromagnetic portion fixed in a resin composition, and the resin composition in which the ferromagnetic portion is formed constitutes a portion of a surface of the capacitor that is different from the surface facing the first wiring layer. With this configuration, the capacitor can be mounted with high positional accuracy with a magnetic action, thus providing a high-performance board incorporating a capacitor unit that does not cause the disconnection of wirings.

In the module incorporating a capacitor of the present invention, it is preferable that the first wiring layer and the capacitor described above are connected via a conductive adhesive containing a conductive powder and a thermosetting resin. With this configuration, the capacitor can be mounted at a relatively low temperature, so that it is possible to mount a capacitor having low heat resistance. Furthermore, when the current collector is a conductive resin composition as in a solid electrolytic capacitor, it is possible to realize stable connection and low resistance. There is no particular limitation with respect to the conductive powder, and it is possible to use silver, gold, copper and nickel, or alloys of these metals, for example. As the thermosetting resin, it is possible to use an epoxy resin, for example.

Preferably, the capacitor-incorporating layer is formed of a mixture containing an inorganic filler and a thermosetting resin. It is possible to embed the capacitor in a state in which the thermosetting resin is uncured, followed by curing the thermosetting resin. The above-described mixture may be used in the form of a sheet, or may be provided with a cavity where the capacitor is embedded. Embedding the capacitor into the above-described mixture in the form of a sheet is like pushing the capacitor into a soft, clay-like material. The thermosetting resin is excellent in heat resistance and insulation, and allows the capacitor to be incorporated into a substrate at a relatively low temperature. Furthermore, the coefficient of linear expansion, the glass transition point and the modulus of elasticity of the electrically insulating layer can be controlled by appropriately selecting the type of the thermosetting resin that constitutes the electrically insulating layer. Moreover, the coefficient of linear expansion, the thermal conductivity and the dielectric constant of the electrically insulating layer can be controlled by appropriately selecting the type and amount of the inorganic filler that constitutes the electrically insulating layer. Accordingly, the capacitor-incorporating layer becomes an electrically insulating layer that has excellent surface flatness and high thermal conductivity and covers the capacitor reliably, without causing any damage to the capacitor.

Preferably, the inorganic filler is at least one selected from the group consisting of $SiO_2$, $Al_2O_3$, MgO, $TiO_2$, BN, AlN and $SiN_4$. These can provide a suitable thermal expansion coefficient and thermal conductivity.

Furthermore, the use of $Al_2O_3$, BN or AlN provides a module with high thermal conductivity. The use of MgO yields a favorable thermal conductivity and a large thermal expansion coefficient. The use of $SiO_2$ (amorphous $SiO_2$ in particular) provides a light-weight module with a small thermal expansion coefficient and a low dielectric constant.

Preferably, the thermosetting resin is at least one selected from the group consisting of an epoxy resins a polyimide resin, a polyphenylene ether resin, a phenol resin, a fluorocarbon resin and an isocyanate resin.

A preferable mixing ratio of the inorganic filler and the thermosetting resin is such that the mixing proportion of the thermosetting resin is in the range of 70 mass % to 95 mass % and the mixing proportion of the thermosetting resin is in the range of 5 mass % to 30 mass %.

Directly above the capacitor-incorporating layer, an inductor component electrically connected to a multi-layered wiring group is disposed. With this configuration, it is possible to focus leakage magnetic fields generated at the time of operating the inductor component. Furthermore, the module incorporating a capacitor of the present invention includes a coil that is formed by a portion of the multi-layered wiring group and a portion of a plurality of interlayer contacts and is formed directly above the capacitor. With this configuration, it is also possible to focus leakage magnetic fields generated at the time of operating the coil.

Alternatively, the module incorporating a capacitor of the present invention includes a coil that is formed by a portion of the multi-layered wiring group and a portion of a plurality of interlayer contacts, and the capacitor serves as the magnetic core of the coil. With this configuration, the ferromagnetic portion of the capacitor has ferromagnetism, so that it is possible to increase the inductance of the coil.

It is preferable that the method for producing a module incorporating a capacitor includes the step of mounting a capacitor including: depositing a conductive adhesive on a predetermined area on the first wiring layer; causing the capacitor to be attracted by an electromagnet with the action of a magnetic field by passing an electric current through a coil of the electromagnet; moving the capacitor attracted to the electromagnet onto the circuit board such that the capacitor is in contact with the first wiring layer via the conductive adhesive; and separating the capacitor from the electromagnet by turning off the electric current passing through the electromagnet. With this configuration, it is possible to attract and separate the capacitor easily using the electromagnet, as well as to mount the capacitor reliably with high positional accuracy.

It is also preferable that the method for producing a module incorporating a capacitor according to the present invention includes a step of mounting a capacitor including: depositing a conductive adhesive on a predetermined area on the first wiring layer; causing the capacitor to be attracted by an electromagnet with the action of a magnetic field by passing an electric current through a coil of the electromagnet; moving the capacitor attracted by the electromagnet onto the circuit board such that the capacitor is in contact with the first wiring layer via the conductive adhesive; thereafter causing the ferromagnetic layer of the capacitor to generate heat by induction heating by applying an alternating current to the coil of the electromagnet, thereby curing the conductive adhesive; and separating the capacitor from the electromagnet by turning off the electric current passing through the coil of the electromagnet. With this configuration, it is possible to cure the conductive adhesive by electromagnetic induction heating at the same time of performing the steps of attracting and separating the capacitor with the electromagnet, thus simplifying the mounting process. Moreover, since the conductive adhesive can be cured while the capacitor is hold on the circuit board by the electromagnet, it is possible to achieve high positional accuracy and stable connection resistance.

Further, it is also preferable that the method for producing a module incorporating a capacitor according to the present invention includes a step of mounting a capacitor including: moving the capacitor onto the circuit board such that the capacitor is in contact with the first wiring layer via the conductive adhesive; placing the circuit board onto an magnet plate having a magnetic action such that the surface of the circuit board on which the capacitor is not placed is in contact with the magnet plate; and curing the conductive adhesive by heating, while generating an attractive force between the capacitor and the first wiring layer of the circuit board, thereby electrically connecting the capacitor to the first wiring layer of the circuit board. With this configuration, it is possible to achieve high positional accuracy and stable connection distance at the time of curing the conductive adhesive, by using the attractive force between the magnet plate and the capacitor. Furthermore, simultaneous mounting of a plurality of capacitors can be performed stably.

In the above-described module incorporating a capacitor of the present invention, each single capacitor unit can be embedded in an electrically insulating layer. Accordingly, it is possible to reduce the thickness of the module incorporating a capacitor, and to increase the density of a capacitor incorporated in the module.

Furthermore, it is preferable that the method for producing a module incorporating a capacitor according to the present invention includes the step of forming a substrate that includes: forming an electrically insulating substrate from a mixture of an inorganic filler and a thermosetting resin, followed by forming a through hole in the electrically insulation substrate. This is because the thermosetting resin is excellent in heat resistance and electrical insulation, and allows the capacitor to be incorporated into a substrate at a relatively low temperature. Furthermore, the coefficient of linear expansion, the glass transition point and the modulus of elasticity of the electrically insulating layer can be controlled by appropriately selecting the type of the thermosetting resin forming the electrically insulating layer. Moreover, the coefficient of linear expansion, the thermal conductivity and the dielectric constant of the electrically insulating layer can be controlled by appropriately selecting the type and the amount of the inorganic filler forming the electrically insulating layer. This prevents, for example, the disconnection of the wiring resulting from the deformation of the electrically insulating layer, so that is possible to obtain a highly reliable module incorporating a capacitor with excellent heat resistance and high speed response.

In a DC-DC converter, which is one of the applications of a capacitor, it is preferable that the electrolytic capacitor component of the present invention is embedded at least in an electrically insulating layer, and an inductor and a semiconductor capacitor are electrically connected and integrated into one piece. With this configuration, it is also possible to embed each single capacitor unit in the electrically insulating layer. Accordingly, it is possible to obtain a high-density DC-DC converter that has desired high capacitance and low ESR (equivalent series resistance, which represents the resistance component of a capacitor) and in which a capacitor with a reduced thickness is mounted and integrated.

It is preferable that the inductor of the DC-DC converter is connected electrically to one of wiring layers forming a multi-layered wiring group and is disposed directly above the capacitor. The reason is that this makes it possible to focus leakage magnetic fields generated at the time of operating the inductor. Further, it is preferable that the inductor of the DC-DC converter is a coil formed by a portion of the multi-layered wiring group and a portion of a plurality of interlayer contacts, and the capacitor serves as the magnetic core of the coil. With this configuration, it is possible to increase the inductance of the coil.

According to the present invention, ferromagnetic means are disposed on or within a capacitor unit included the capacitor, so that the capacitor unit easily can be handled as a single component. In particular, the capacitor unit can be mounted easily onto a board as a single component. Furthermore, the capacitor can be transported with a magnetic action, realizing automatic mounting. With the use of the capacitor of the present invention, it is possible to achieve stronger adhesion between the capacitor and a substrate, thereby improving the mountability of the capacitor. With the use of the capacitor of the present invention, it is also possible to achieve miniaturization and higher density for various modules incorporating a capacitor.

Hereinafter, preferred embodiments of the present invention are described with reference to the accompanying drawings as necessary. In the drawings, the same reference numerals are given to components that are substantially the same.

Embodiment 1

Figure 1B:
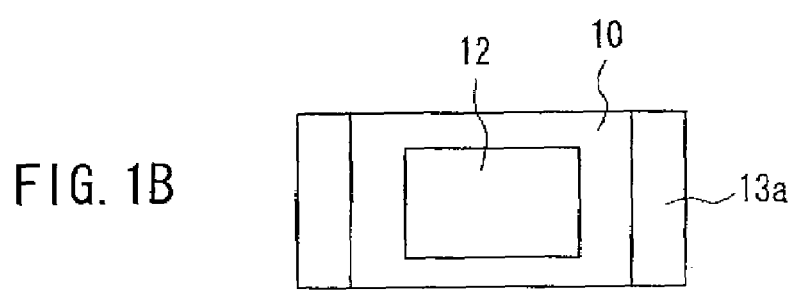
FIG. 1B is a plan view of the same capacitor.

A capacitor according to the present invention is described with reference to FIG. 1. FIG. 1A is a schematic side view of the capacitor, and FIG. 1B is a schematic plan view of the capacitor. The capacitor is a surface mount type capacitor whose overall shape is substantially that of rectangular solid.

The capacitor includes a capacitor unit 10, connection terminals 13a and 13b disposed at both ends of the capacitor unit 10 and a ferromagnetic foil 12 bonded onto the capacitor unit 10. In this capacitor, the reverse side relative to the principal surface 11, on which the ferromagnetic foil 12 is formed, serves as a mounting surface 14.

The above-described capacitor is produced as follows. First, a ferromagnetic foil 12 is formed in a predetermined shape by cutting or punching. A liquid or paste adhesive is applied onto a previously produced capacitor unit 10 provided with connection terminals 13a and 13b. Subsequently, the ferromagnetic foil 12 formed in a predetermined shape is placed on the capacitor unit 10. The ferromagnetic foil 12 is fixed onto the capacitor unit 10 by drying or curing the adhesive, forming a foil-type ferromagnetic portion (ferromagnetic portion).

Preferably, the surface mount type capacitor is worked into a generally rectangular shape, regardless of the type (e.g., an electrolytic capacitor, a thin film capacitor, a film-wound capacitor or a laminated ceramic capacitor) of the capacitor unit 10.

This capacitor is configured such that the center of gravity of the capacitor unit 10 and that of the ferromagnetic foil 12 are aligned in a perpendicular direction. Compared with a configuration in which the ferromagnetic foil 12 is disposed at a different location, this configuration permits more stable attraction when the capacitor is attracted and raised by an electromagnet (transport member), thereby preventing the capacitor from falling during a transport operation.

Figure 2A:
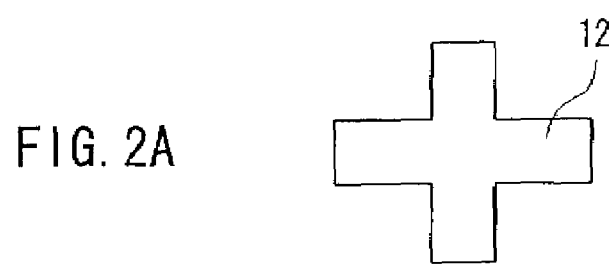
FIGS. 2A to C are plan views for illustrating the shape of a ferromagnetic portion of the capacitor according to Embodiment 1 of the present invention.
Figure 2B:
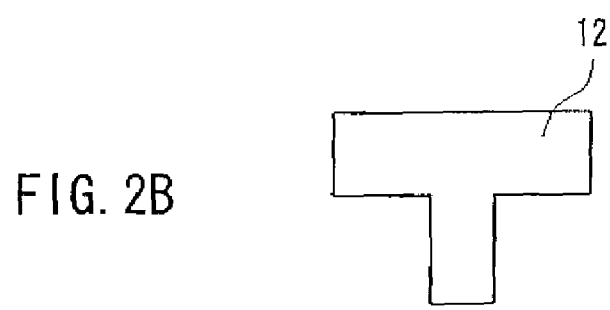
Figure 2C:
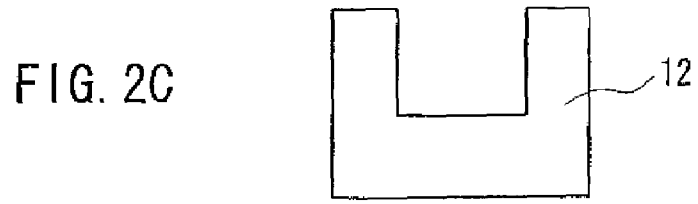

While the surface of the attracted side of the ferromagnetic foil 12 shown in FIG. 1B has a rectangular (convex polygonal) outline, other configurations for preventing positional or rotational shift more effectively during transporting the capacitor and during attracting of the capacitor by the electromagnet are described with reference to FIGS. 2A to C. FIGS. 2A to C are plan views showing the surface of the attracted side of the ferromagnetic portions with a configuration capable of preventing rotational or positional shift during mounting the capacitor to a substrate. FIG. 2A shows a ferromagnetic portion having a cross-shaped outline, FIG. 2B shows a ferromagnetic portion having a T-shaped outline and FIG. 2C shows a ferromagnetic portion having a U-shaped outline.

When the capacitor includes the ferromagnetic foils 12 with any of the outlines shown in having the outlines shown in FIGS. 2A to C, the difference between the attracting force when the attracting step is performed accurately and the attracting force when a minute rotational or positional shift occurs is greater than in the case of a capacitor including the ferromagnetic foil 12 having a rectangular (convex polygonal) outline shown in FIG. 1B. This results in a stronger attracting force that allows the capacitor to be attracted to an accurate position, thereby preventing rotational or positional shift.

In the case of the capacitor shown in FIGS. 1A and B, the ferromagnetic foil 12 is disposed only on the principal surface 11, which is the surface opposite to the mounting surface 14. However, it is sufficient that the ferromagnetic foil is disposed at least at a portion of the principal surface 11. The ferromagnetic foil further may be applied to the side surface of the capacitor unit 10, or to the mounting surface 14. When the ferromagnetic foil is electrically conductive, however, the ferromagnetic foil is disposed so as not to be in contact with either of the mutually separated connection terminals 13a and 13b.

Although the previously produced capacitor unit 10 equipped with the connection terminals 13a and 13b is used in the above-described production method, it is possible to produce a capacitor by consecutively forming the capacitor unit 10, the connection terminals 13a and 13b and the ferromagnetic foil 12. In this case, it does not matter which of the connection terminals 13a and 13b and the ferromagnetic foil 12 is formed first.

Although the adhesive is applied to the capacitor unit 10 in the production method of the present embodiment, it is possible to produce a capacitor with a similar configuration by applying the adhesive to the ferromagnetic foil worked into a predetermined shape and placing the ferromagnetic foil with the adhesive onto the capacitor unit 10. Furthermore, although a liquid or paste adhesive is used in the production method of this embodiment, it is possible to use a capacitor with a similar configuration by using an adhesive sheet in place of the adhesive. In the case of using an adhesive sheet, it is also possible to produce a capacitor by placing the adhesive sheet on the capacitor unit, followed by placing the ferromagnetic foil 12 on the capacitor unit with the adhesive sheet interposed between the capacitor unit and the ferromagnetic foil 12, or by placing the adhesive sheet on the ferromagnetic foil 12, followed by placing the ferromagnetic foil 12 on the capacitor unit with the adhesive sheet interposed between the capacitor unit and the ferromagnetic foil 12.

Although a configuration in which the ferromagnetic foil 12 is bonded to the capacitor unit 10 is described above, it is possible to employ a configuration including, in place of the ferromagnetic foil 12, a particle-dispersed ferromagnetic portion (ferromagnetic portion) containing a resin composition and ferromagnetic particles dispersed and fixed in the resin composition. In the case of this configuration, a capacitor can be produced as follows.

First, a paste mixture is prepared by mixing a resin, which will later form a resin composition, with a powder of ferromagnetic particles. Next, the paste mixture is deposited onto a previously produced capacitor unit 10 equipped with connection terminals 13a and 13b. By drying or curing the paste mixture, the paste mixture is fixed onto the capacitor unit 10, forming a ferromagnetic portion. Examples of the method for depositing the paste mixture on the capacitor unit 1 include an application process and a printing process such as screen printing. In the case of depositing the paste mixture using a printing process such as screen printing, the ferromagnetic portion easily can be formed in a desired shape by varying the shape of the printing plate. Here, it is preferable that a thermosetting resin is used as the resin. The reason is that in the case of using a thermosetting resin, the particle-dispersed ferromagnetic portion and the capacitor unit can be fixed to each other firmly by curing the thermosetting resin by heating.

Embodiment 2

Figure 3A:
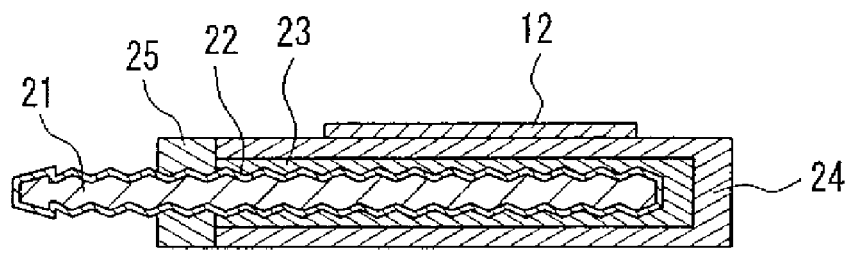
FIG. 3A is a cross-sectional view of a capacitor according to Embodiment 2 of the present invention.
Figure 3B:
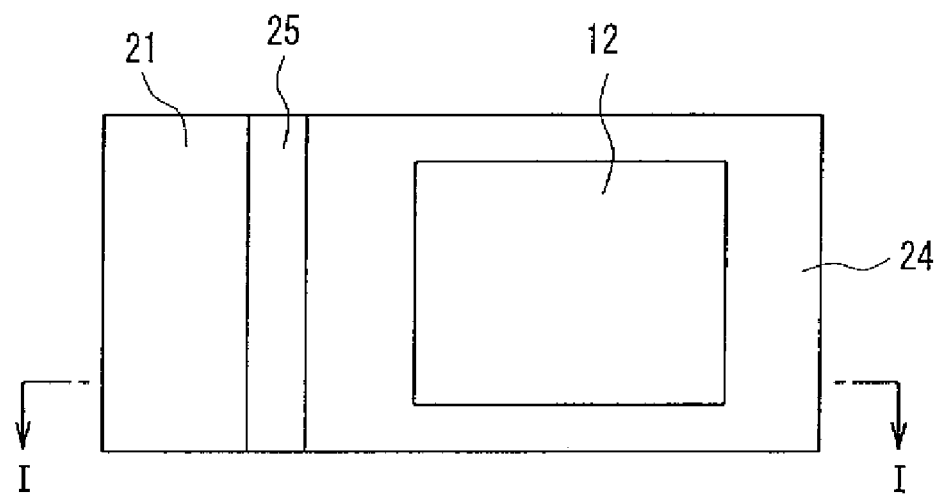
FIG. 3B is a plan view of the same capacitor.

In Embodiment 2 of the present invention, a capacitor A (hereinafter, referred to as "electrolytic capacitor component A") including an electrolytic capacitor as a capacitor unit and a ferromagnetic portion formed on the electrolytic capacitor is described with reference to FIGS. 3A and B. FIG. 3A shows a cross-sectional view, and FIG. 3B shows a plan view. FIG. 3A is a cross-sectional view taken on the line I-I in FIG. 5B.

The electrolytic capacitor component A includes: an anode valve metal 21; a dielectric oxide film 22; a solid electrolyte 23; a cathode current collector 24; an insulator 25 for ensuring the electrical insulation between the anode valve metal 21 and the cathode current collector 24; and a ferromagnetic portion 12. It should be noted that the insulator 25 is not an essential component of the present invention, but preferably is provided for electrically insulating the anode valve metal 21 and the cathode current collector 24 reliably.

The ferromagnetic portion 12 may be a foil-type ferromagnetic portion bonded onto the electrolytic capacitor, or a particle-dispersed ferromagnetic portion fixed onto the electrolytic capacitor. Furthermore, the ferromagnetic portion 12 may be a foil-type ferromagnetic portion fixed directly onto the electrolytic capacitor without using an adhesive.

As shown in FIG. 3A, it is preferable that the surface of the anode valve metal 21 is roughened. The reason is that this configuration increases the surface area and thus increases the capacitance of the electrolytic capacitor. Examples of the anode valve metal 21 include a foil made of at least one valve metal material selected from the group consisting of Al, Ta and Nb, and a sintered material made of at least one valve metal material selected from the above-described group. In terms of cost and productivity such as workability, it is preferable to use an Al foil as the material of the anode valve metal 21, since an Al foil is available at low cost and its surface can be roughened easily.

Examples of the solid electrolyte 23 include a conductive polymer composition composed only of a conductive polymer, and a conductive polymer composition containing a conductive polymer and a dopant. In terms of conductivity, it is preferable that a dopant is included in the solid electrolyte 23, since it increases the conductivity of and decreases the resistance of the solid electrolyte 23. Examples of the conductive polymer include polypyrrole, polythiophene and polyaniline. Examples of the dopant include ionized arylsulfonic acid such as an alkylnaphthalene sulfonic acid and para-toluenesulfonic acid, and ionized aryl phosphoric acid.

Examples of the cathode current collector 24 include a laminate formed by a carbon layer and one or a plurality of metal layers selected from the group consisting of a silver layer, a copper layer a nickel layer and an aluminum layer that is formed on the carbon layer, and a laminate formed by a carbon layer and an alloy layer including a plurality of metal materials selected from the group consisting of silver, copper, nickel and aluminum that is formed on the carbon layer.

Examples of the insulator 25 include an insulating polymer composition including an insulating polymer. Examples of the insulating polymer include polyimide, polyamide, polyphenylene ether (PPE), polyphenylene sulfide (PPS) or polyphenylene oxide (PPO).

Next, a method for producing an electrolytic capacitor component A of the present embodiment is described.

First, a case is described where the ferromagnetic portion 12 is a foil-type ferromagnetic portion bonded to the electrolytic capacitor, or a particle-dispersed ferromagnetic portion fixed to the electrolytic capacitor is described.

Figure 5A:
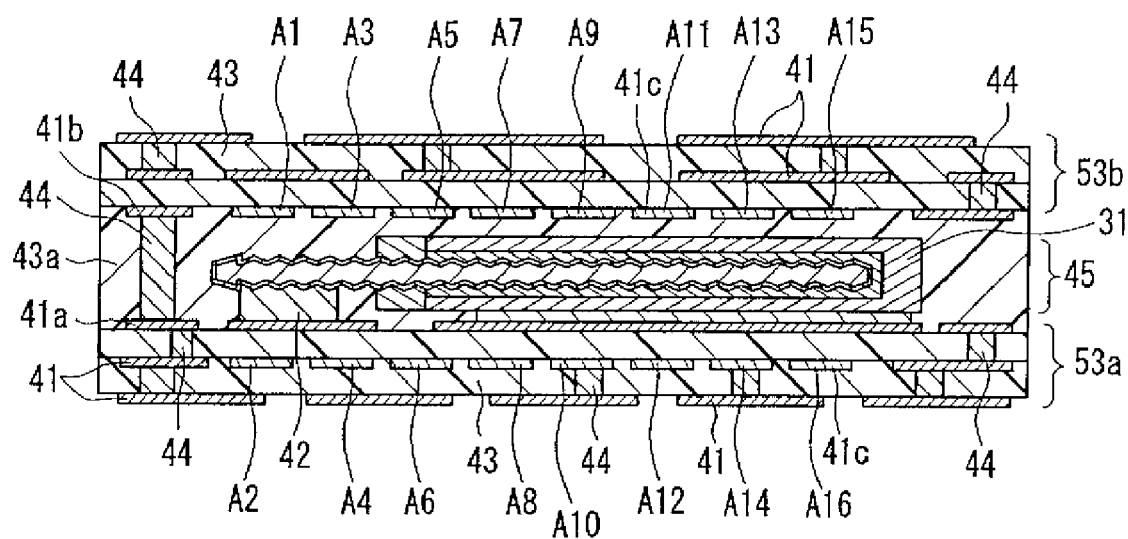
FIG. 5A is a cross-sectional view of a module incorporating a capacitor according to Embodiment 4 of the present invention.

First, the surface of a metal foil, which will later form an anode valve metal 21, is roughened. For example, the surface of the metal foil, which will later form an anode valve metal 21, is electrolytically etched in an electrolyte containing hydrochloric acid as the main component, by applying an alternating current to the metal foil. Consequently, the surface of the valve metal foil is roughened, obtaining an anode valve metal 21 with fine depressions and protrusions on its surface, as shown in FIG. 5A. In the case of using a metal foil as the anode valve metal 21, it is preferable to perform this step in order to increase the surface area and thus to increase the capacitance of the electrolytic capacitor. In the case of using a sintered material as the anode valve metal 21, on the other hand, it is not necessary to perform this step, since a sintered material generally inherently has fine concavities and convexities on its surface.

Next, a dielectric oxide film 22 is formed on the surface of the anode valve metal 21. For example, the anode valve metal 21 is subjected to anodic oxidation in a neutral electrolyte, forming a dielectric oxide film 22 with a desired withstand voltage on the surface of the anode valve metal. Generally, the dielectric oxide film 22 is formed into a thickness in the range of at least 1 nm to at most 20 nm. It should be noted that the thickness of the dielectric oxide film 22 is not limited to this range, and may be selected appropriately depending on the desired properties of the electrolytic capacitor component.

Next, a solid electrolyte 23 is formed on a portion of the surface of the anode valve metal 21. For example, after masking a portion of the anode valve metal 21, a monomer of a conductive polymer is polymerized by chemical polymerization or the combination of chemical polymerization and electrolytic polymerization, using a solution containing a dopant and the monomer. The thus produced conductive polymer composition serves as a solid electrolyte 23. Furthermore, in the anode valve metal 21, a portion on which the solid electrolyte 23 is formed serves as a capacitance forming portion, and a portion on which the solid electrolyte 23 is not formed serves as an electrode lead portion. Examples of the conductive polymer include polypyrrole, polythiophene and polyaniline.

Next, an insulator 25 is formed on the anode valve metal 21 at a boundary between the capacitance forming portion and the electrode lead portion, with the dielectric oxide film 22 interposed between the insulator 25 and the anode valve metal 21. The insulator 25 is formed by, for example, bonding an insulating tape to a predetermined position. To reliably ensure reliable insulation between the anode valve metal 21 and a cathode current collector 24, which will be produced later, it is preferable to provide sealing with the insulating tape.

Next, a cathode current collector 24 is formed on the surface of the solid electrolyte 23. In the formation of a cathode current collector 24, for example, a carbon layer is formed by applying a carbon paste onto the surface of the solid electrolyte 23, followed by drying the carbon paste, and a silver layer is formed by applying a silver paste onto the carbon layer, followed by drying the silver paste by curing. By these steps, it is possible to form a cathode current collector 24 in which the carbon layer and the silver layer are laminated. The application of the carbon paste and the silver paste can be performed using dipping, for example. In this step, a metal foil such as Cu and Al can be used, in place of the silver paste. In this case, after applying the carbon paste, the metal foil is placed on the carbon paste without curing the carbon paste, followed by curing the carbon paste. Consequently, the metal foil is bonded to the solid electrolyte 23.

Next, treatments to repair defects in the dielectric oxide film 22 and to insulate the solid electrolyte 23 are conducted. The treatments are performed by, for example, holding the resulting structure in a high-temperature and high-humidity atmosphere (e.g., temperature: 85° C. and relative humidity: 80% RH) at a predetermined voltage, followed by drying. Upon completion of the treatments, an electrolytic capacitor can be obtained.

Finally, a foil-type ferromagnetic portion or a particle-dispersed ferromagnetic portion is formed on the electrolytic capacitor as the ferromagnetic portion 12 in the same manner as in Embodiment 1 described above. By performing the above-described steps, it is possible to produce an electrolytic capacitor component A with the configuration shown in FIGS. 3A and B.

Next, a second case is described in which the ferromagnetic portion 12 is a foil-type ferromagnetic portion fixed directly to an electrolytic capacitor. Until after the step in which the formation of the insulator 25 is completed, the same steps are performed as in the case where the ferromagnetic portion 12 is the above-described foil-type ferromagnetic portion or the above-described particle-dispersed ferromagnetic portion.

In the formation of the cathode current collector 24 that is performed after forming the insulator 25, a carbon layer is formed by applying a carbon paste onto the surface of the solid electrolyte 23 and curing the carbon paste. Then, after applying a silver paste onto the carbon layer, a ferromagnetic foil worked into a predetermined shape is deposited on the silver paste, without curing the silver paste. Next, a silver layer is formed by curing the silver paste by heating, while bonding the ferromagnetic foil to the silver layer. By these steps, it is possible to form a cathode current collector 24 in which the carbon layer and the silver layer are laminated, while forming a ferromagnetic foil fixed directly onto the electrolytic capacitor as the ferromagnetic portion 12. The application of the carbon paste and the silver paste can be performed using dipping, for example.

Finally, treatments to repair defects in the dielectric oxide film 22 and to insulate the solid electrolyte 23 arc conducted. The treatments are performed by, for example, holding the resulting structure in a high-temperature and high-humidity atmosphere (e.g., temperature: 85° C. and relative humidity: 80% RH) at a predetermined voltage, followed by drying. By performing the above-described steps, it is possible to produce an electrolytic capacitor component A with the configuration shown in FIGS. 3A and B.

Although the anode valve metal 21 is provided with only one electrode lead portion in the electrolytic capacitor component A shown in FIGS. 3A and B, the electrolytic capacitor component A of the present invention may have a three-terminal configuration in which the anode valve metal 21 is provided with two electrode lead portions, or a four-terminal configuration in which both the cathode current collector 24 and the anode valve metal 21 are provided with two electrode lead portions. These configurations also can be applied to the electrolytic capacitor components in the embodiments described below.

Embodiment 3

Figure 4:
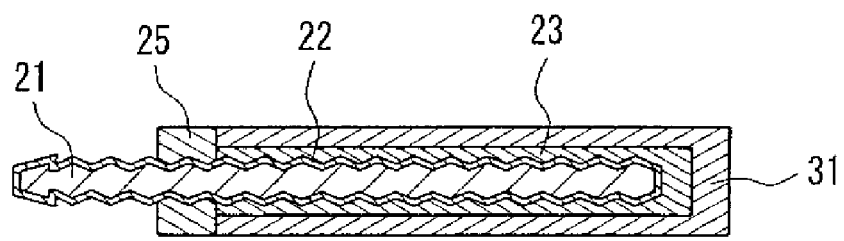
FIG. 4 is a cross-sectional view of a capacitor according to Embodiment 3 of the present invention.

A capacitor B (hereinafter, referred to as "electrolytic capacitor component B") of the present invention that includes an electrolytic capacitor as a capacitor unit is described with reference to FIG. 4. FIG. 4 is a schematic cross-sectional view showing one mode of the configuration of an electrolytic capacitor component B (capacitor) according to Embodiment 3 of the present invention.

The electrolytic capacitor component B includes: an anode valve metal 21; a dielectric oxide film 22; a solid electrolyte 23; a cathode ferromagnetic current collector 31; an insulator 25 for ensuring the electrical insulation between the anode valve metal 21 and the cathode ferromagnetic current collector 31. It should be noted that the insulator 25 is not essential, but preferably is provided for electrically insulating the anode valve metal 21 and the cathode current collector 24 reliably.

In the electrolytic capacitor component shown in FIG. 4, the cathode ferromagnetic current collector 31 serves as both a cathode current collector and a ferromagnetic portion of the electrolytic capacitor. The cathode ferromagnetic current collector 31 may include a conductive resin composition and ferromagnetic particles as the ferromagnetic portion, or may include a conductive resin composition, ferromagnetic particles as the ferromagnetic portion and metal particles including a metallic material other than a ferromagnetic material. A preferable thickness of the ferromagnetic current collector 31 is in the range of 50 μm to 200 μm.

The electrolytic capacitor component shown in FIG. 4 has the same configuration as the electrolytic capacitor component A described in Embodiment 2 above, except that the cathode ferromagnetic current collector 31 is used in place of the ferromagnetic portion 12 and the cathode current collector 24 (see FIG. 3). Therefore, the cathode ferromagnetic current collector 31 is described in the following, and the same reference numerals are given to the same components, the description of which is omitted.

The total content of the ferromagnetic particles and the metal particles in the cathode ferromagnetic current collector 31 is preferably in the range of at least 50 mass % and at most 90 mass %, more preferably in the range of at least 60 mass % and at most 90 mass %. When the total content of the ferromagnetic particles and the metal particles in the cathode ferromagnetic current collector 31 is less than 50 mass %, the conductivity of the cathode ferromagnetic current collector 31 becomes too low. On the other hand, when the content is more than 90 mass %, the strength with which the conductive resin composition disperses and fixes the ferromagnetic particles and the metal particles is reduced. As the metal particles, it is preferable to use metal particles having a higher conductivity than the ferromagnetic particles. Furthermore, it is preferable that the relative content of the ferromagnetic particles to the total content of the ferromagnetic particles and the metal particles is in the range of at least 50 mass % and at most 100 mass %. When the content is in this range, both the conductivity required for the current collector and the ferromagnetism required for the ferromagnetic portion can be satisfied adequately.

The cathode ferromagnetic current collector 31 needs to have a desired conductivity and a desired ferromagnetism, and it is preferable to determine the content of the ferromagnetic particles first such that the desired ferromagnetism can be obtained, and then to determine the content of the metal particles having higher conductivity than the ferromagnetic particles such that the desired conductivity can be obtained. In terms of ensuring the conductivity of the conductive resin composition, a configuration in which the metal particles are included supplementarily in the cathode ferromagnetic current collector 31 is more preferable that a configuration in which no metal particles are included. With this configuration, it is possible to ensure the conductivity of the conductive resin composition, and to control the conductivity by adjusting the content of metal particles.

Preferably, the metal particles have an average particle size of at least 0.1 μm and at most 100 μm. When the average particle size is less than 0.1 μm, it is difficult to obtain an effective conductivity. When the average particle size is more than 100 μm, the thickness of the cathode current collector increases, which is practically disadvantageous.

As the material of the metal particles, it is preferable to use a metal that is excellent in conductivity and stability (e.g., resistant to corrosion by oxidation). Examples of such metal particles include particles containing at least one metal selected from the group consisting of silver, copper, gold and palladium as the main component, and particles containing an alloy including one or a plurality of different metals selected from the above-described metal group as the main component. It is particularly preferable that the metal particles are silver particles, copper particles, alloy particles containing silver particles as the main component, or alloy particles containing copper particles as the main component. This is because silver and copper are less expensive than gold and palladium, and have a higher conductivity than other commonly used metals.

Preferably, the conductive resin composition included in the cathode ferromagnetic current collector 31 is made of a thermosetting resin that has conductivity after it is cured. The reason is that the ferromagnetic particles or the metal particles can be dispersed and fixed firmly in a thermosetting resin composition by mixing the ferromagnetic particles or the metal particles with an uncured thermosetting resin and thereafter curing the thermosetting resin by heat treatment. Examples of the thermosetting resin that has conductivity at least after it is cured include an epoxy resin, a phenol resin and a polyimide resin. These thermosetting resins can be used preferably, since they are highly reliable under extreme environmental conditions, such as high temperatures, high humidities and low temperatures. The conductive resin composition included in the cathode ferromagnetic current collector 31 further may include a curing agent, a curing catalyst, a surfactant and/or a coupling agent.

Here, a method for producing the electrolytic capacitor component B of the present embodiment is described with reference to FIG. 4. It should be noted that the electrolytic capacitor component B of this embodiment is produced by performing the same steps as in Embodiment 2 described above until after completing the formation of the solid electrolyte 23, and therefore, the redundant description is omitted.

A paste mixture is prepared in advance by mixing ferromagnetic particles and a paste of a thermosetting resin that will later have conductivity after curing. In the case of forming a ferromagnetic current collector including metal particles, an additive and the like, a paste mixture is prepared by mixing metal particles and/or an additive, ferromagnetic particles and a paste of the thermosetting resin in this step.

After forming the solid electrolyte 23, a cathode ferromagnetic current collector 31 is formed. First, a carbon layer is formed by applying a carbon paste onto the surface of the solid electrolyte 23, followed by curing the carbon paste. Subsequently, a mixture layer is formed by applying the paste mixture onto the carbon layer, followed by curing the paste mixture by heat treatment. This results in formation of a cathode ferromagnetic current collector 31 in which the carbon layer and the mixture layer are laminated. The application of the carbon paste and the paste mixture can be performed using dipping, for example.

Finally, treatments to repair defects in the dielectric oxide film 22 and to insulate the solid electrolyte 23 are conducted. The treatments are performed by, for example, holding the resulting structure in a high-temperature and high-humidity atmosphere (e.g., temperature: 85° C. and relative humidity: 80% RH) at a predetermined voltage, followed by drying. It is preferable to perform this step in order to produce an electrolytic capacitor component B with excellent properties. By performing the above-described steps, it is possible to produce an electrolytic capacitor component (capacitor) with the configuration shown in FIG. 4.

Embodiment 4

Figure 5B:
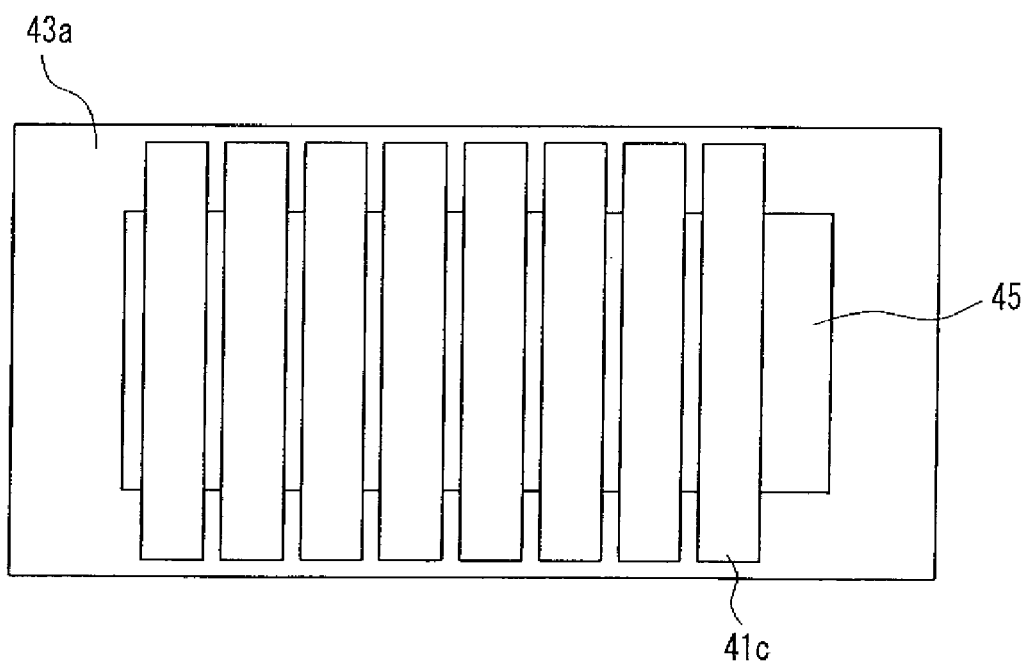
FIG. 5B is a perspective view, focusing on the coil of the same module.
Figure 6A:
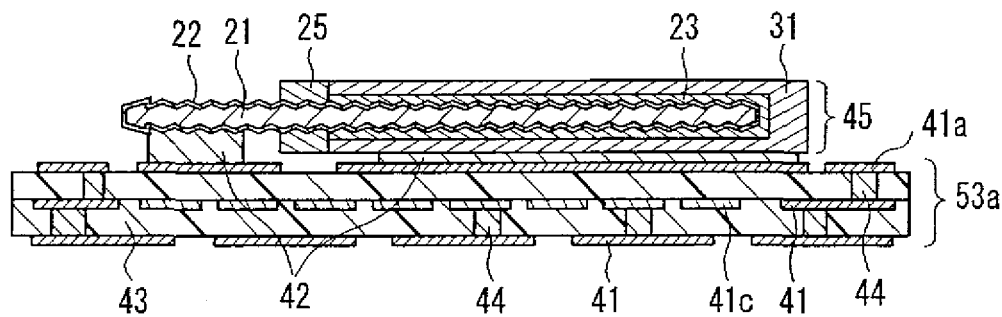
FIGS. 6A to C are cross-sectional views showing a production process of the module incorporating a capacitor according to Embodiment 4 of the present invention.
Figure 6B:
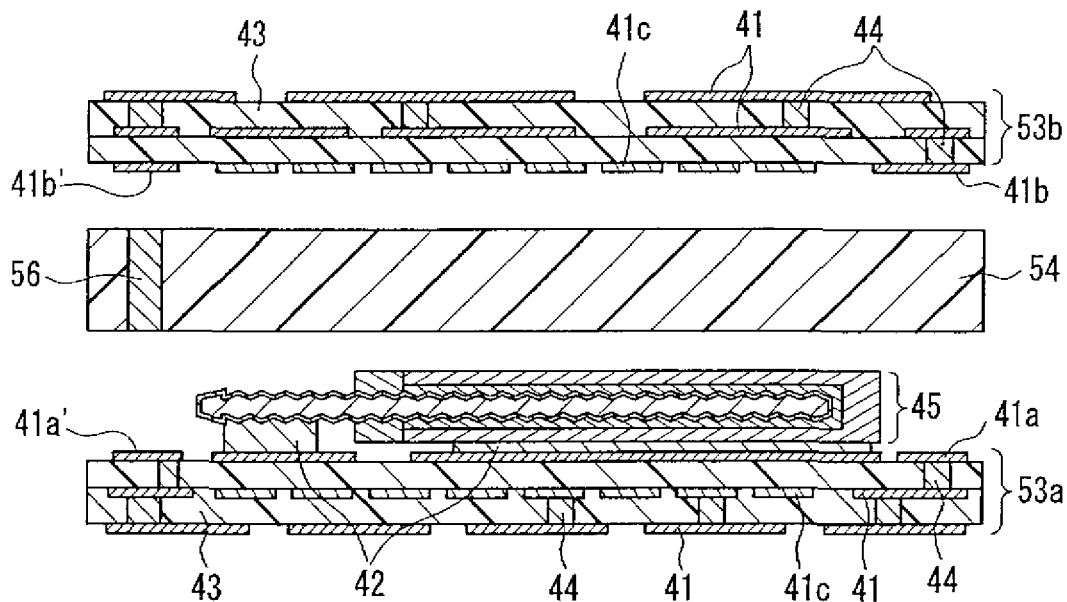
Figure 6C:
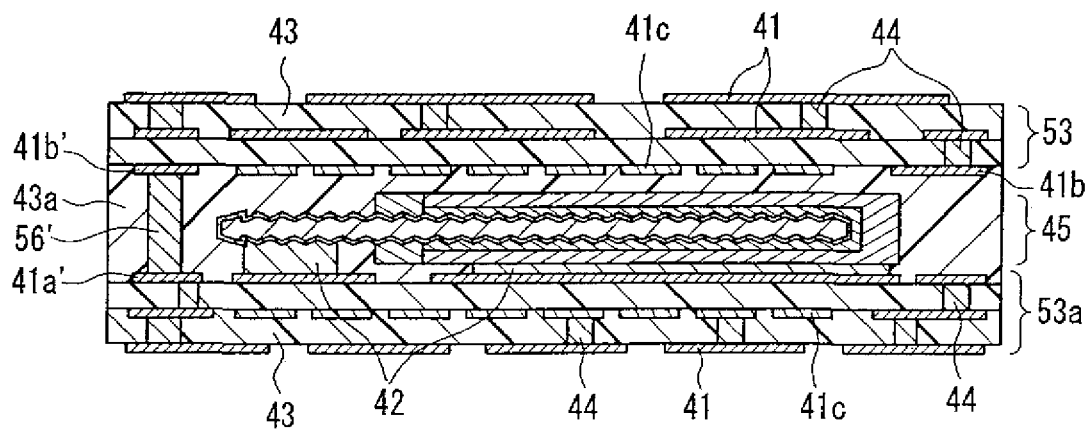

In Embodiment 4 of the present invention, an example in which a module incorporating a capacitor is produced using the capacitor shown in FIG. 4 is described with reference to FIGS. 5A and B and FIGS. 6A to C. The module incorporating a capacitor of this embodiment includes a spirally-configured wiring (transverse coil) having its central axis in a direction parallel with the principal plane of the module incorporating a capacitor, and a ferromagnetic layer of the capacitor serves as the magnetic core. FIG. 5A is a schematic cross-sectional view, and FIG. 5B is a semi-exposed plan view, viewed from the upper side. It should be noted that FIG. 5B shows only representative components that are necessary to describe the characteristic features of the present embodiment. FIGS. 6A to C are schematic cross-sectional views for illustrating the respective steps of a production process of the module incorporating a capacitor of the present embodiment.

In the module incorporating a capacitor shown in FIGS. 5A and B, a first circuit board 53a including: three wiring layers 41 including a first wiring layer 41a; two electrically insulating layers 43; and a plurality of via contacts 44 embedded in the two electrically insulating layers 43 is provided first. On the first circuit board 53a, a capacitor-incorporating layer 43a is arranged which includes: a conductive adhesive portion 42 disposed on the first wiring layer 41a; an electrolytic capacitor component 45 as produced in Embodiment 3 above which is electrically connected to the first wiring layer 41a via the conductive adhesive portion 42; and a plurality of via contacts 44 embedded in the capacitor-incorporating layer 43a. On the capacitor-incorporating layer 43a, a second circuit board 53b is arranged which includes: three wiring layers 41 including a second wiring layer 41b; two electrically insulating layers 43; and a plurality of via contacts embedded in those two electrically insulating layers 43. Finally, all of the above-described components are integrated into one piece.

The electrolytic capacitor component 45 is embedded in the capacitor-incorporating layer 43a. Here, an electrically insulating portion is formed by the two electrically insulating layers 43 included in the first circuit board 53a, the capacitor-incorporating layers 43a and the two electrically insulating layers 43 included in the second circuit board 53b (a total of five insulating layers). A multi-layered wiring group is formed by the three wiring layers 41 (including the first wiring layer 41a) included in the first circuit board 53a and three wiring layers 41 (including the second wiring layer 41b) included in the second circuit board 53b (a total of six wiring layers). A plurality of interlayer contacts are formed by a plurality of the via contacts 44 included in the first circuit board 53a, the via contacts 44 embedded in the capacitor-incorporating layer 43a and a plurality of the via contacts 44 included in the second circuit board 53b.

Further, the module incorporating a capacitor shown in FIGS. 5A and B includes a wiring (coil) that is formed by a coil wiring 41c constituting a portion of the multi-layered wiring group and a via contact for the coil (not shown) constituting a portion of a plurality of the interlayer contacts and whose magnetic core is a ferromagnetic layer 31 of the electrolytic capacitor component 45. More specifically the coil shown in FIGS. 5A and B is formed by the coil wiring 41c constituting a portion of the wiring layer group made up of the wiring layer 41 disposed in the first circuit board 53a, the first wiring layer 41a and the second wiring layer 41b, and the via contact for coil constituting a portion of the via contact group made up of a plurality of the via contacts 44 embedded in the electrically insulating layer 43 disposed between the wiring layer 41 and the first wiring layer 41a disposed in the first circuit board 53a and a plurality of the via contacts 44 embedded in the capacitor-incorporating layer 43a. That is, the wiring layers A1 to A16 shown in FIG. 5A are connected electrically in the form of a coil.

A method for producing the module incorporating a capacitor of Embodiment 4 is described with reference to FIGS. 6A to C. The following four components are prepared in advance. First, as shown in FIG. 6A, the first circuit board 53a is prepared, in which the three wiring layers 41 including the first wiring layer 41a exposed on the surface are formed. Second, as shown in FIG. 6B, the second circuit board 53b is prepared, in which the three wiring layers 41 including the second wiring layer 41b exposed on the surface are formed. Third, a conductive adhesive containing a conductive filler and an uncured thermosetting resin is prepared. Fourth, a sheet-like electrically insulating substrate 54 including an uncured thermosetting resin composition and an insulating filler is prepared. Additionally, as shown in FIG. 6B, the electrically insulating substrate 54 is provided with a through hole in advance, and a via paste 56 is filled into the through hole.

Next, the conductive adhesive is deposited on a predetermined area of the first wiring layer 41a formed on the surface of the first circuit board 53a, and the electrolytic capacitor component 45 is transported onto the first circuit board 53a with a magnetic action, followed by curing the conductive adhesive by heat treatment, thereby forming a conductive adhesive portion 42. This completes the mounting of the electrolytic capacitor component 45 onto the first circuit board 53a, as shown in FIG. 6A.

Next, the electrically insulating substrate 54 and the second circuit board 53b are laminated in the order shown in FIG. 6B on the side of the first circuit board 53a onto which the electrolytic capacitor component 45 is mounted, and a stop of performing heating and pressing is carried out at the same time. The heating and pressing are performed, for example, at 150° C. under a pressure of 1 MPa (10 Kg/cm$^2$) for about 15 minutes. It should be noted that the second circuit board 53b is laminated on the electrically insulating substrate 54 such that the second wiring layer 41b formed on the second circuit board 53b is in contact with the electrically insulating substrate 54. By performing these steps, the module incorporating a capacitor shown in FIG. 5 is produced.

At the time of performing the heat treatment, an alternating current may be applied to the electromagnet used for the transport operation, and the heat treatment may be performed using electromagnetic induction between the ferromagnetic material and the electromagnet, in addition to performing an ordinary heating in the atmosphere. This makes it possible to cure the conductive adhesive, while pressing the electrolytic capacitor component 45, so that the electrolytic capacitor component 45 can be mounted onto a desired position with high positional accuracy and stable connection resistance. The frequency and the amplitude of the alternating current to be applied and the period of time over which the alternating current is applied may be selected appropriately depending on the temperature of the ferromagnetic portion. In order to prevent an excessive temperature increase, the alternating current also may be applied in a pulsed manner.

Figure 7:
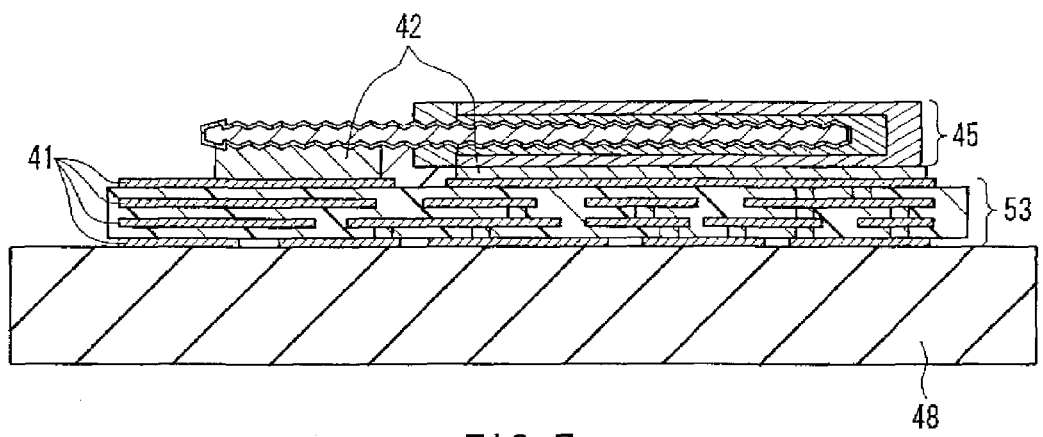
FIG. 7 is a cross-sectional view showing a production process of the module incorporating a capacitor according to Embodiment 4 of the present invention.

FIG. 7 shows another step performed during heat treatment. In FIG. 7, the reference numeral 48 denotes a magnet plate. As shown in FIG. 7, the magnet plate 48 is arranged on a surface of a circuit board 53 that is opposite to the surface on which the electrolytic capacitor component 45 is mounted. By curing the conductive adhesive by performing heat treatment in this state, the conductive adhesive portion 42 is formed, and the electrolytic capacitor component 45 is fixed to the circuit board 53 and is connected electrically to the first wiring layer 41a, as shown in FIG. 5A. This step allows the electrolytic capacitor component 45 to be attracted by the magnet plate 48 at the time of curing the conductive adhesive by heating, thereby stabilizing the accuracy and the electrical connection during the mounting. There is no particular limitation with respect to the magnet plate, as long as it does not lose its magnetic force significantly at the heat treatment temperature. For example, it is possible to use a ferrite magnet or a rare-earth compound.

In the following, the first circuit board 53a and the second circuit board 53b included in the module incorporating a capacitor are described. The circuit boards 53a and 53b shown in FIG. 5A constitute a multi-layered circuit board including: four wiring layers 41 (including the first wiring layer 41a); three electrically insulating layers 43 each disposed between two adjacent wiring layers 41; and via contacts 44 that are embedded in the electrically insulating layers 43 and that electrically connects two adjacent wiring layers. There is no particular limitation with respect to the substrate material of the circuit board 53, and examples include a printed circuit board using a glass-epoxy substrate, a paper-phenol substrate or an aramid-epoxy substrate as the substrate, as well as a ceramic board using an alumina substrate or a glass-alumina substrate as the substrate.

The wiring material that forms the wiring layers 41 may be selected appropriately depending on the type of the circuit board 53. For example, it is possible to use as the wiring material, a copper foil for the printed circuit board, and a sintered metal powder including Cu, Ag, Pd, Mo, W or the like for the ceramic board.

Preferably, the electrically insulating layers 43 disposed in the circuit boards 53 shown in FIG. 5A are formed of the same material as that of the capacitor-incorporating layer 43a that will be describe later. This is because all the electrically insulating layers 43 (including the capacitor-incorporating layer 43a) in the finally obtained module incorporating a capacitor are formed of the same material by selecting the same material as that of the capacitor-incorporating layer 43a, so that it is possible to reduce internal stress caused by laminating different materials. This results in an improved reliability in the electrical connection of the module incorporating a capacitor.

In the following, the conductive adhesive forming the conductive adhesive portion 42 is described. The conductive adhesive may be composed only of an electrically conductive thermosetting resin composition and a conductive filler, or it further may include one or a plurality of different additives. Examples of the conductive thermosetting resin composition contained in the conductive adhesive include an epoxy resin, a phenol resin, a polyamide resin and a polyamide-imide resin. These resins can be used preferably because of their high reliability. There is no particular limitation with respect to the conductive filler contained in the conductive adhesive, as long as it has a low specific resistance and a low contact resistance, as well as being relatively stable against acids and bases. Specific examples of the conductive filler include a filler including one filler metal selected from the group consisting of Ag, Cu, Au, Pd and Pt, a filler containing one filler metal selected from the above-described group as the main component, and an alloy filler containing an alloy including one or a plurality of different filler metals selected from the above-described group as the main component. It is particularly preferable that the conductive filler is an Ag filler, a Cu filler, an alloy filler containing Ag as the main component, or an alloy filler containing Cu as the main component. This is because Ag and Cu are less expensive than Au, Pd and Pt, and have a higher conductivity than other commonly used metals. As the additive added to the conductive adhesive, it is possible to use, for example, one or a plurality of different additives selected from the group consisting of a curing agent, a curing catalyst, a surfactant, a coupling agent and a lubricant.

The conductive adhesive can be prepared by mixing a conductive thermosetting resin, a conductive filler and/or an additive. As the mixing method, it is possible to user, for example, a mixing process using three rolls, or a mixing process using a planetary mixer.

In the following, the sheet-like electrically insulating substrate 54, which will later become the capacitor-incorporating layer 43a, is described. Together with the thermosetting resin, the electrically insulating substrate may include one insulating filler, or it may include a plurality of insulating fillers made of different materials. The electrically insulating substrate 54 further may include an additive.

The electrically insulating substrate 54 can be produced by the following procedure. First, a mixture is prepared by mixing a predetermined amount of a thermosetting resin, which is uncured, and a predetermined amount of an insulating filler. There is no particular limitation with respect to the mixing method used at this time, and it is possible to use, for example, a process using a planetary mixer, a ball milling process using ceramic balls, or a process using a planetary stirrer. In the case of adding an additive to the electrically insulating substrate 54, the additive is mixed together with the thermosetting resin and the insulating filler.

Next, the resulting mixture is processed into a sheet. There is no particular limitation with respect to the method for processing the mixture, and the method may be selected appropriately depending on the condition of the thermosetting resin. Specific examples include doctor blading, extrusion, a process using a curtain coater and a process using a roll coater. Particularly, doctor blading or extrusion can be used preferably because of their simplicity.

At the time of processing the mixture into a sheet, the viscosity of the mixture may be adjusted by further adding a solvent upon mixing an inorganic filler and a thermosetting resin, depending on the specific processing method used. Examples of the solvent that can be used for adjusting the viscosity include methyl ethyl ketone (MEK), isopropanol and toluene. In the case where a solvent is added to form a sheet member, it is necessary to remove the solvent component by performing a drying treatment on the sheet member. There is no particular limitation with respect to the drying treatment, as long as it is performed at a temperature below the temperature at which the curing of the thermosetting resin starts.

Examples of the thermosetting resin that can be used for forming the electrically insulating substrate 54 includes an epoxy resin, a phenol resin, an isocyanate resin and a polyamide-imide resin. These resins can be used preferably because of their high reliability.

As the insulating filler included in the electrically insulating substrate 54, it is preferable to use a particulate filler with a diameter in the range of at least 0.1 μm and at most 100 μm. The mixing ratio of the insulating filler in the electrically insulating substrate is preferably in the range of at least 60 mass % and at most 95 mass %, more preferably in the range of at least 70 mass % and at most 95 mass %. When the mixing ratio is less than 60 mass %, the effect resulting from mixing the insulating filler is reduced. When the mixing ratio is more than 95 mass %, on the other hand, the mixture to which the insulating filler is mixed is difficult to process into a sheet. Examples of the insulating filler include an inorganic filler. More specifically, it is preferable to use an inorganic filler that includes $Al_2O_3$, $SiO_2$, SiC, AlN, BN, MgO or $Si_3N_4$. Particularly, an inorganic filler that includes $Al_2O_3$ or $SiO_2$ easily can be mixed with the thermosetting resin, so that the use of this filler makes it possible to produce an electrically insulating substrate 54 in which the inorganic filler is mixed at a high concentration (mixing ratio). Furthermore, the use of an inorganic filler including $Al_2O_3$, SiC or AlN provides a higher thermal conductivity for the electrically insulating substrate 54 than the use of other inorganic fillers. This also results in improved heat dissipation of the capacitor-incorporating layer 43a.

Examples of the additive contained in the electrically insulating substrate 54 include a curing agent, a curing catalyst, a coupling agent, a surfactant and a coloring agent.

It is preferable that the electrically insulating substrate 54 has a thermal expansion coefficient in the range of at least $5\times10^{-6}$/K and at most $35\times10^{-6}$/K. The reason is that the difference in thermal expansion coefficient between the electrically insulating substrate and those of the electrolytic capacitor, the wiring and a copper-plated layer that are incorporated in the capacitor-incorporating layer, and an inductor and a semiconductor component, which will be described later, is small when the thermal expansion coefficient is in this range. Accordingly, the generation of internal stress can be prevented, which makes the module incorporating a capacitor reliable. It is also preferable that the capacitor-incorporating layer 43a has a thermal conductivity in the range of at least 1 W/m·K and at most 10 W/m·K. This is because the heat dissipation of the capacitor-incorporating layer 43a is favorable when the thermal conductivity is in this range, so that the heat generated from the capacitor can be dissipated to the outside quickly. Accordingly, it is possible to suppress the temperature increase in various circuit components incorporated in the module incorporating a capacitor and to increase their allowable current. The thermal expansion coefficient and the thermal conductivity may be adjusted depending on the type of the thermosetting resin or the type and the mixing ratio of the insulating filler that constitute the electrically insulating substrate 54.

The through hole for filling the via paste 56 into the electrically insulating substrate may be formed using, for example, a NC punching machine or a carbon dioxide gas laser. Alternatively, the through hole may be formed by punching using a die.

The via paste 56 is formed by mixing a powder of conductive particles and an uncured thermosetting resin. As the mixing method, it is possible to use the same method as that employed for producing a resin-based conductive adhesive. The via paste 56 may include only one kind of conductive particles, or may include plural kinds of conductive particles. Examples of the conductive particles contained in the via paste 56 include particles composed only of one metal for via paste selected from the group consisting of Ag, Cu, Au, Pd and Pt, particles containing one metal for via paste selected from the above-described group as the main component, particles composed only of an alloy including a plurality of metals for via paste selected from the above-described group, and particles containing a plurality of metals for via paste selected from the above-described group as the main component. As the metal particles included in the via paste 56, it is particularly preferable to use particles composed only of Ag or Cu, or particles composed only of an alloy including Ag or Cu. Here, "main component" means a component that constitutes at least 50 mass % of the metal particles included in the via paste. "Containing a plurality of metals as the main component" means that a total of a plurality of metals constitutes at least 50 mass % of the metal particles for the via paste.

Examples of the thermosetting resin contained in the via paste 56 include an epoxy resin, a phenol resin, an isocyanate resin, polyamide resin and a polyimide resin. These resins can be used preferably because of their high reliability. In addition, a curing agent, a curing catalyst, a lubricant, a coupling agent, a surfactant, a high boiling solvent and/or a reactive diluent further may be added to the via paste 56.

There is no particular limitation with respect to the method for filling the via paste 56 into the through hole of the electrically insulating substrate 54, and it is possible to use screen printing, for example.

In the following, a step of depositing the conductive adhesive is described. As the method for depositing the conductive adhesive at a predetermined area on the surface of the wiring layers 41 in the circuit board 53, it is possible to use a printing process and a method using a dispenser. Considering the productivity, it is preferable to use a printing process using a metal mask.

The heat treatment in the step of forming the conductive adhesive portion 42 is carried out at a temperature above the temperature at which the conductive thermosetting resin contained in the conductive adhesive starts curing. When the heat treatment temperature is too high, there may be cases in which the solid electrolyte in the electrolytic capacitor component 45 thermally decomposes, producing a harmful effect on the properties of the electrolytic capacitor. Therefore, the heat treatment is performed at a temperature below the temperature at which the solid electrolyte starts to thermally decompose. Preferably, the heat treatment is performed at a temperature in the range of at least 80° C. and at most 80° C. for a time period in the range of at least 5 minutes and at most 30 minutes.

The following describes the step of laminating the electrically insulating substrate 54 and the second circuit board 53b on the circuit board 53 to which the electrolytic capacitor component 45 is mounted, followed by heating and pressing. The heat treatment temperature in this step can be selected appropriately such that the thermosetting resin and the via paste 56 that are contained in the electrically insulating substrate 54 can be cured and the solid electrolyte in the electrolytic capacitor 45 is not adversely affected. Preferably the treatment temperature is selected from the range of at least 120° C. and at most 200° C. The electrolytic capacitor 45 is positioned in (i.e., embedded in) the electrically insulating substrate 54. Further, the electrically insulating substrate 54 becomes a capacitor-incorporating layer 43a integrated with circuit boards 53a and 53b, and a first wiring layer 41a' and a wiring layer 41b' of the circuit board 53b are connected electrically by a via contact 56'. Preferably, the treatment pressure is selected from the range of at least 0.1 MPa and at most 3 MPa.

A conductive foil 57 forms the second wiring layer 41b in the finally obtained module incorporating a capacitor. Examples of the conductive foil 57 include a copper foil, a nickel foil and an aluminum foil. The thickness of the conductive foil 57 can be selected appropriately such that the second wiring layer 41b has a desired conductivity. Generally, the thickness is in the range of at least 9 µm and at most 35 µm. There is no particular limitation with respect to the method for patterning the conductive foil 57. For example, it is possible to use chemical etching using an aqueous solution of iron chloride or copper chloride.

The circuit board 53 shown in FIG. 5 is a multi-layered circuit board. However, the circuit board 53 also may be a double-sided circuit board (circuit board including a multi-layered wiring consisting of two wiring layers) in which the wiring layer is provided only on both sides of the substrate, or a single-sided circuit board (single wiring) in which the wiring layer is provided on one side of the substrate. Furthermore, although four wiring layers 41 are laminated in the circuit board 53 shown in FIG. 5, the number of the layers is not limited to this.

Although a thermosetting resin is used as the resin contained in the conductive adhesive in the present embodiment, it is possible to use any other resin that is electrically conductive and capable of fixing the electrolytic capacitor component 45. However, in order to bond the first wiring layer 41a and the electrolytic capacitor component 45 firmly, it is preferable to use a conductive thermosetting resin. As the conductive adhesive, it is also possible to use a commercially available conductive adhesive.

In the present embodiment, a resin-based conductive adhesive is used as the conductive adhesive for forming the conductive adhesive portion 42. However, the conductive adhesive is not limited to these, and a metal-based conductive adhesive can be used, for example. Examples of the metal-based conductive adhesive include a lead-tin based (Pb—Sn based) solder alloy and a lead-free, Sn-based solder alloy (an alloy of Sn with Ag, Cu, In, Zn, Bi or the like). As the conductive adhesive, a resin-based conductive adhesive is more preferable than a metal-based conductive adhesive. The reason is that a resin-based conductive adhesive, in particular the one containing a conductive thermosetting resin, has a lower heat curing temperature than that of a solder alloy (i.e., a metal-based conductive adhesive), and therefore suppresses the thermal damage caused to the capacitor 45, the circuit board 53 and the like. Moreover, it is possible to avoid the situation where the cathode ferromagnetic current collector included in the electrolytic capacitor component 45 forms an alloy with a solder alloy and thus causes unstable electrical connection between the ferromagnetic current collector and the solder alloy.

In this embodiment, a single sheet member having a thickness required to embed the electrolytic capacitor component 45 therein is used as the electrically insulating substrate 54, as shown in FIG. 6B. However, it is also possible to use a laminate of a plurality of sheet members with a specific thickness. In this case, the thickness of the electrically insulating substrate 54 is adjusted to a desired thickness by selecting the number of the laminated sheet members. In the case of using this technique of adjusting the thickness of the electrically insulating substrate 54 with the number of the laminated sheet members, it is possible to form all the electrically insulating layers formed on the circuit board only by sheet members with a specific thickness without depending on other incorporated circuit components, by preparing a plurality of such sheet members. Further, the electrically insulating substrate 54 can be provided with a recessed portion of a desired shape by laminating a sheet member with a specific thickness from which an unnecessary portion is removed as necessary by cutting away or punching out, and another sheet member with a specific thickness. For example, by providing a recessed portion of a shape substantially corresponding to the shape of the capacitor to be embedded, it is possible to reduce the deformation (especially, the transverse flow of the above-described substances constituting the insulating substrate) of the electrically insulating substrate 54 in the step of performing heating and pressing. When an electrically insulating substrate 54 with a recessed portion is used, the surface flatness can be ensured at a lower treatment pressure, compared with when an electrically insulating substrate 54 without a recessed portion is used. Moreover, mechanical damage during the pressing can be reduced, since the treatment can be performed at a low pressure. Furthermore, it is possible to prevent the positional shift of the via contacts 44 embedded in that electrically insulating substrate 54, since the deformation of the electrically insulating substrate is reduced. This increases the positional accuracy of the via contacts 44 embedded in the electrically insulating substrate 54, thus suppressing the increase in contact resistance between the via contacts 44 and the first wiring layer 41a or the disconnection between them.

In the module incorporating a capacitor shown in FIGS. 5A and B, the coil (inductor) can be formed simultaneously with the formation of the multi-layered wiring group. Furthermore, since the electrolytic capacitor component 45 having the ferromagnetic portion is disposed in the coil, it is possible to increase the density of and to decrease the thickness of the module incorporating a capacitor. At the same time, since the electrolytic capacitor component 45 serves as the magnetic core of the coil, the inductance of the coil can be increased. Further, since the central axis direction (winding direction) of the coil is in the direction of the principal plane of the module incorporating a capacitor, the number of turns of the coil can be increased without increasing the substrate thickness, providing the advantage of decreasing the thickness and increasing the inductance. Further still, since the circuit boards 53a and 53b are used on both sides of the module, it is not necessary to form each single wiring layer 41 by patterning the conductive foil, thereby easily producing a module incorporating a capacitor in which a coil is embedded.

Embodiment 5

Figure 8A:
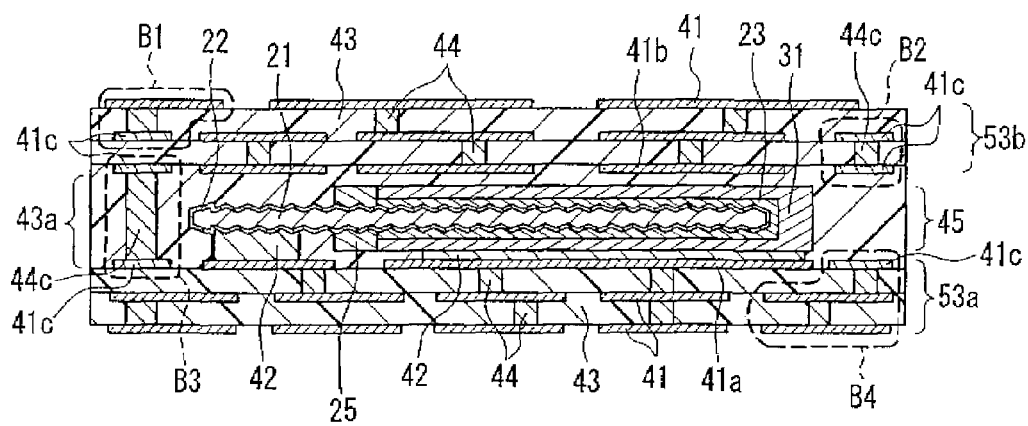
FIG. 8A is a cross-sectional view of a module incorporating a capacitor according to Embodiment 5 of the present invention.
Figure 8B:
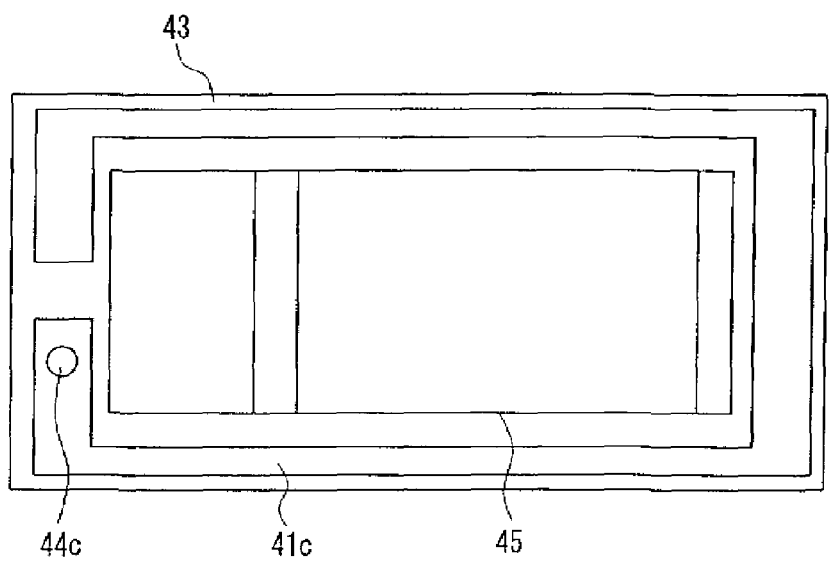
FIG. 8B is a plan view, focusing on the coil of the same module.

The module incorporating a capacitor of this embodiment includes a spirally-configured wiring (longitudinal coil) having its central axis in the thickness direction of the module incorporating a capacitor, and the capacitor shown in FIG. 4 serves as the magnetic core of the coil. FIGS. 8A and B are diagrams showing the configuration of the module incorporating a capacitor according to the present embodiment, FIG. 8A is a cross-sectional view, and FIG. 8B is a semi-exposed plan view, viewed from the upper side. It should be noted that FIG. 8B shows only representative components that are necessary to describe the characteristic features of the present embodiment.

In the module incorporating a capacitor shown in FIGS. 8A and B, first, a first circuit board 53a is provided which includes: three wiring layers including a first wiring layer 41a; two electrically insulating layers; and a plurality of via contacts 44 embedded in the two electrically insulating layers. On the first circuit board 53a, a capacitor-incorporating layer 43a is arranged that includes: a conductive adhesive portion 42 disposed on the first wiring layer 41a; and an electrolytic capacitor component 45 as produced in Embodiment 3 above which is electrically connected to the first wiring layer A1a via the conductive adhesive portion 42 and is embedded in the capacitor-incorporating layer 43a. On the capacitor-incorporating layer 43a, a second circuit board 53b is arranged that includes: three electrically insulating layers 43 including the capacitor-incorporating layer 43a, three wiring layers 41 including a second wiring layer 41b formed on the capacitor incorporating layer 43a: a plurality of via contacts 44 embedded in the three electrically insulating layers 43. Here, an electrically insulating portion is formed by the two electrically insulating layers 43 of the circuit board 53a and the three electrically insulating layers 43 (including the capacitor-incorporating layer 43a) formed on the circuit board 53a (a total of five insulating layers). A multi-layered wiring group is formed by the three wiring layers 41 (including the first wiring layer 41a) of the circuit board 53a and the three wiring layers 41 (including the second wiring layer 41b) formed on the circuit board 53a (a total of six wiring layers). Moreover, a plurality of interlayer contacts are formed by a plurality of the via contacts 44 embedded in the circuit board 53a and a plurality of the via contacts 44 embedded in the three insulating layers 43 disposed on the circuit board 53a.

Furthermore, the module incorporating a capacitor shown in FIGS. 8A and B includes a coil that is formed by a coil wiring 41c constituting a portion of the multi-layered wiring group and a via contact for coil 44c constituting a portion of a plurality of the interlayer contacts and whose magnetic core is the capacitor. More specifically, the coil shown in FIGS. 8A and B is formed by the coil wiring 41c constituting a portion of the wiring layer group made up of the first wiring layer 41a, the second wiring layer 41b and the neighboring wiring layer 41 disposed on the second wiring layer 41b, and the via contact 44c constituting a portion of the via contact group made up of a plurality of the via contacts embedded in the capacitor-incorporating layer 43a and a plurality of the via contacts 44 embedded in the neighboring electrically insulating layer 43 disposed on the capacitor-incorporating layer 43a. That is, B1, B2, B3 and B4 shown in FIG. 8A are electrically connected, thereby forming a longitudinal coil.

A method for producing the module incorporating a capacitor of the present embodiment is described. The following three components are prepared in advance. First, as shown in FIG. 8A, a first circuit board 53a is prepared in which three wiring layers 41 including a first wiring layer 41a with a predetermined wiring pattern on the surface are formed. Second, a conductive adhesive containing a conductive filler and an uncured thermosetting resin is prepared. Third, three sheet-like electrically insulating substrates containing an uncured thermosetting resin composition and an insulating filler are prepared. Additionally, the electrically insulating substrates are provided with a through hole in advance, and a via paste is filled into the through hole.

Next, similarly to Embodiment 4 above, the conductive adhesive is deposited on a predetermined area of the first wiring layer 41a formed on the surface of the first circuit board 53a, and the electrolytic capacitor component 45 is transported onto the circuit board 53a with a magnetic action, followed by curing the conductive adhesive by heat treatment, forming a conductive adhesive portion 42. Then, the electrically insulating substrate and the second circuit board 53b are laminated in this order on the side of the circuit board 53a onto which the electrolytic capacitor component 45 is mounted, followed by performing heating and pressing. The heating and pressing are performed, for example, at 150° C. under a pressure of 1 MPa (10 Kg/cm$^2$) for about 15 minutes, in the same manner as described above. Thus, the module incorporating a capacitor shown in FIGS. 8A and B is produced.

In the module incorporating a capacitor shown in FIGS. 8A and B, the coil (inductor) can be formed simultaneously with the formation of the multi-layered wiring group. Furthermore, since the electrolytic capacitor component 45 having the ferromagnetic portion is disposed in the coil forming that inductor, it is possible to increase the density of and to decrease the thickness of the module incorporating a capacitor. At the same time, since the ferromagnetic portion of the electrolytic capacitor component 45 serves as the magnetic core of the coil, it is possible to increase the inductance of the coil.

Embodiment 6

Figure 9:
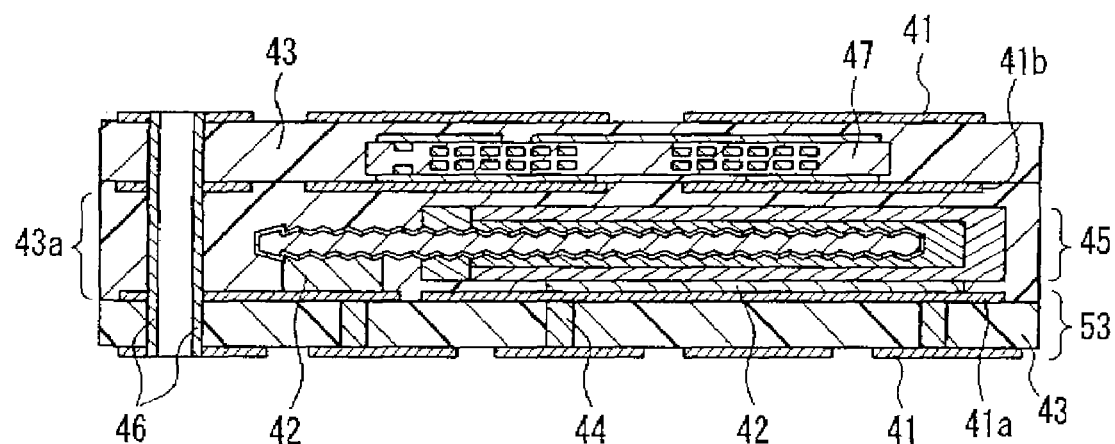
FIG. 9 is a cross-sectional view of a module incorporating a capacitor according to Embodiment 6 of the present invention.

In the present embodiment, one mode of a module incorporating a capacitor that uses the capacitor of the present invention is described with reference to FIG. 9. FIG. 9 is a schematic cross-sectional view showing a module incorporating a capacitor according to this embodiment.

The module incorporating a capacitor shown in FIG. 9 includes: a circuit board 53 that includes two wiring layers 41 including a first wiring layer 41a, an electrically insulating layer 43 and a plurality of via contacts 44 embedded in the electrically insulating layer 43; a conductive adhesive portion 42 disposed on the first wiring layer 41a; an electrolytic capacitor component 45 as produced in Embodiment 3 above which is electrically connected to the first wiring layer 41a via the conductive adhesive portion 42; a capacitor-incorporating layer 43a; a second wiring layer 41b formed on the capacitor-incorporating layer 43a; an inductor component 47 electrically connected to the second wiring layer; a second electrically insulating layer 43; a wiring layer formed on the second electrically insulating layer 43; and a through hole contact 46 formed in a through hole penetrating the capacitor-incorporating layer. The electrolytic capacitor component 45 is embedded in the capacitor-incorporating layer 43a, and the inductor component 47 is embedded in the electrically insulating layer 43 disposed on the capacitor-incorporating layer 43a. Further, the inductor component 47 is disposed directly above the electrolytic capacitor component 45. Here, an electrically insulating portion is formed by the electrically insulating layer 43 of the circuit board 53 and the two electrically insulating layers 43 (including the capacitor-incorporating layer 43a) disposed on the circuit board 53 (a total of three insulating layers). A multi-layered wiring group is formed by the two wiring layers 41 (including the first wiring layer 41a) of the circuit board 53 and two wiring layers 41 (including the second wiring layer 41b) disposed on the circuit board 53 (a total of four wiring layers). Moreover, a plurality of interlayer contacts are formed by a plurality of the via contacts 44 of the circuit board 53, as well as a plurality of via contacts 44 and the through hole contact 46 of the two insulating layers 43 (including the capacitor-incorporating layer 43a) disposed on the circuit board 53.

A method for producing the module incorporating a capacitor shown in FIG. 9 is described. The following three components are prepared in advance. First, a circuit board 53 is prepared in which two wiring layers 41 including a first wiring layer 41a exposed on the surface are formed. Second, a conductive adhesive containing a conductive filler and an uncured thermosetting resin is prepared. Third, two sheet-like electrically insulating substrates 54 including an uncured thermosetting resin composition and an insulating filler are prepared.

Next, similarly to Embodiment 4 above, the conductive adhesive is deposited on a predetermined area of the first wiring layer 41a formed on the surface of the circuit board 53, and the electrolytic capacitor component 45 is transported onto the circuit board 53 with a magnetic action, followed by curing the conductive adhesive by heat treatment, forming a conductive adhesive portion 42. Subsequently, the electrically insulating substrate and a conductive foil are laminated on the side of the circuit board 53 onto which the electrolytic capacitor component 45 is mounted, followed by performing heating and pressing, forming a capacitor-incorporating layer 43a. Then, a second wiring layer 41b is formed by patterning the conductive foil.

The conductive foil forms the second wiring layer 41b in the finally obtained module incorporating a capacitor. Examples of the conductive foil include a copper foil, a nickel foil and an aluminum foil. The thickness of the conductive foil can be selected appropriately such that the second wiring layer 41b has a desired conductivity. Generally, the thickness is in the range of at least 9 μm and at most 35 μm. There is no particular limitation with respect to the method for patterning the conductive foil. For example, it is possible to perform chemical etching using an aqueous solution of iron chloride or copper chloride.

Next, the inductor component 47 is mounted onto the second wiring layer 41b, and the electrically insulating substrate and a conductive foil are laminated on the side of the circuit board 53 onto which the inductor component 47 is mounted by the same method as that used for forming the capacitor-incorporating layer 43a, followed by performing heating and pressing. Consequently, the inductor component 47 is embedded in the electrically insulating substrate 54 and the electrically insulating substrate is cured, forming electrically insulating layers 43. Thus, the inductor component 47 is incorporated in the module incorporating a capacitor.

Next, a through hole penetrating all of the layers is formed. In this step, it is possible to use any method that can be used for a common printed circuit board. For example, the through hole can be formed by processing using a drill.

Then, a through hole contact 46 is formed by plating the inner side surface of the through hole with copper. As the plating method, it is possible to use panel plating, which can be used for a common printed circuit board. It should be noted that the through hole contact 46 also may be formed after patterning the conductive foil described below. In this case, in order to protect the wiring layer 41s on which the wiring pattern is formed beforehand, it is preferable to provide the wiring layers 41 with a protective film using a resist.

Next, wiring layers 41 are formed by patterning the conductive foil exposed on the surface. By performing the above-described steps, the module incorporating a capacitor show in FIG. 9 can be produced.

Examples of the inductor included in the inductor component 47 include a wire wound inductor and a chip inductor, and it is particularly preferable that the inductor is formed by a sheet-like coil including one or two flat plate-shaped windings. With this preferable configuration, it is possible to reduce the thickness of the inductor, and hence to reduce the thickness of the module incorporating a capacitor.

The method for producing and applying the conductive adhesive, and the method for producing the electrically insulating substrate 54 are the same as described above in connection with Embodiment 4. Therefore, the detailed description is omitted here. Further, the heating and pressing for embedding the electrolytic capacitor component 45 into the capacitor-incorporating layer 43a and the heating and pressing for embedding the inductor component 47 into the electrically insulating layer 43 formed on the capacitor-incorporating layer 43a are performed in the same manner as the heating and pressing (see FIG. 6B) for embedding the electrolytic capacitor component 45 into the capacitor-incorporating layer 43a in Embodiment 4 above.

Since the inductor component 47 is disposed directly above the electrolytic capacitor component 45 in the capacitor-incorporating layer shown in FIG. 9, the magnetic flux leaking into the peripheral portion of the inductor component 47 can be focused with the ferromagnetic portion of the electrolytic capacitor component 45. Moreover, the magnetic permeability of the inductor can be improved and therefore the inductance is higher than when the inductor is disposed as a single component, or when it is disposed directly above a conventional capacitor.

Since the capacitor-incorporating layer shown in FIG. 9 uses the through hole contact 46 formed inside the through hole, it also can be used in high current density applications. Although FIG. 9 only shows the through hole contact 46 for the capacitor-incorporating layer 43a and the electrically insulating layer 43 formed on the electrically insulating layer 43a without showing any via contact, it is possible to use the through hole contact 46 and via contacts in combination, thereby making it possible to use appropriately a portion with a large amount of current and a portion with a small amount that can be increased in density.

Embodiment 7

Figure 10:
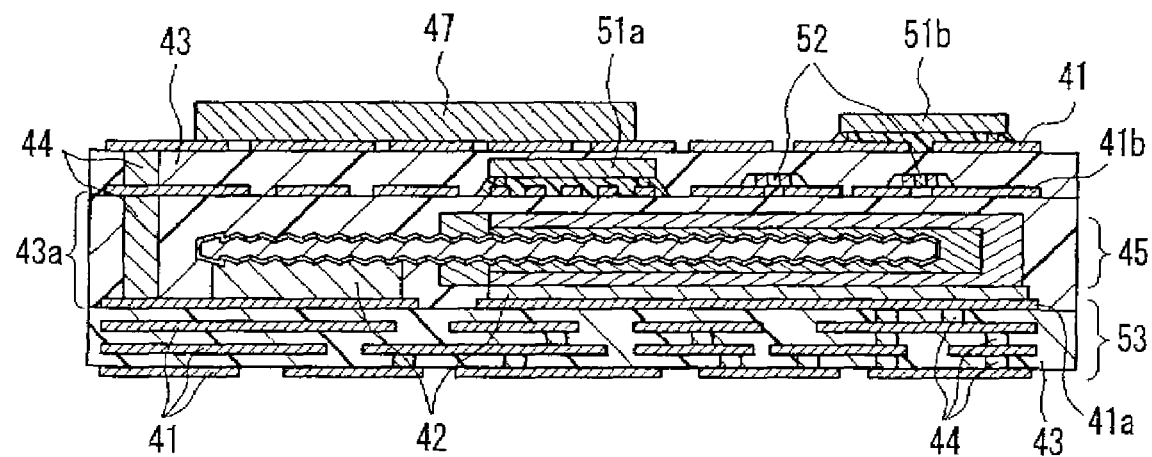
FIG. 10 is a cross-sectional view of a module incorporating a capacitor according to Embodiment 7 of the present invention.

In the present embodiment, one mode of a module incorporating a capacitor that uses the capacitor of the present invention is described with reference to FIG. 10 and FIGS. 11A to D. FIG. 10 is a schematic cross-sectional view showing the configuration of a module incorporating a capacitor according to this embodiment. The module incorporating a capacitor of this embodiment includes a capacitor of the present invention, an inductor component, a semiconductor capacitor and a bare chip semiconductor component.

The module incorporating a capacitor shown in FIG. 10 includes: a circuit board 53 that includes four wiring layers including a first wiring layer 41a, three electrically insulating layers and a plurality of via contacts embedded in the three electrically insulating layers; a conductive adhesive portion 42 disposed on the first wiring layer 41a; an electrolytic capacitor component 45 as produced in Embodiment 3 above that is electrically connected to the first wiring layer 41a via the conductive adhesive portion 42; two electrically insulating layers 43 that include a capacitor-incorporating layer 43a and is disposed on the circuit board 53; two wiring layers that include a second wiring layer 41b and are disposed on the capacitor-incorporating layer 43a; a plurality of via contacts 44 embedded in the two electrically insulating layers 43 disposed on the capacitor-incorporating layer 43a; a first semiconductor component 51a and bare chip semiconductor components 52 that are electrically connected to the second wiring layer 41b; and a second semiconductor component 51b and an inductor component 47 that are electrically connected to the wiring layer 41 disposed above the second wiring layer 41b. The electrolytic capacitor component 45 is embedded in the capacitor-incorporating layer 43a, the first semiconductor component 51a and the bare chip semiconductor components 52 are embedded in the electrically insulating layer 43 disposed on the capacitor-incorporating layer 43a, and the second semiconductor component 51b and the inductor component 47 are exposed on the surface. Here, an electrically insulating portion is formed by the three electrically insulating layers 43 of the circuit board 53 and the two electrically insulating layers (including the capacitor-incorporating layer 43a) formed on the circuit board 53 (a total of five insulating layers). A multi-layered wiring group is formed by the four wiring layers 41 (including the first wiring layer 41a) of the circuit board 53 and the two wiring layers 41 (including the second wiring layer 41b) disposed on the circuit board (a total of six wiring layers). Moreover, a plurality of interlayer contacts are formed by a plurality of the via contacts 44 of the circuit board 53 and a plurality of the via contacts 44 of the two insulating layers 43 (including the capacitor-incorporating layer 43a) formed on the circuit board 53.

Figure 11A:
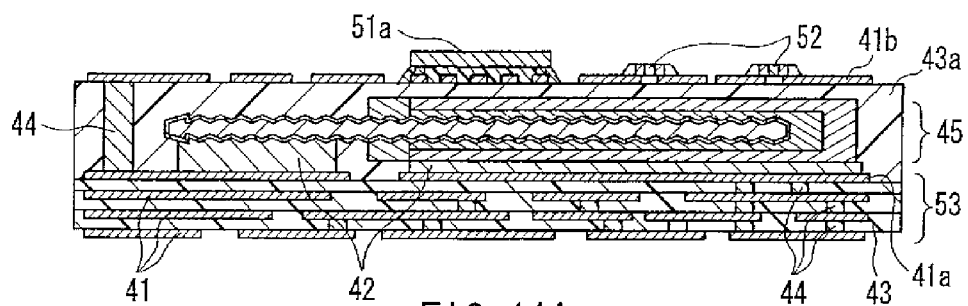
FIGS. 11A to D are cross-sectional views showing a production process of the module incorporating a capacitor according to Embodiment 7 of the present invention.
Figure 11B:
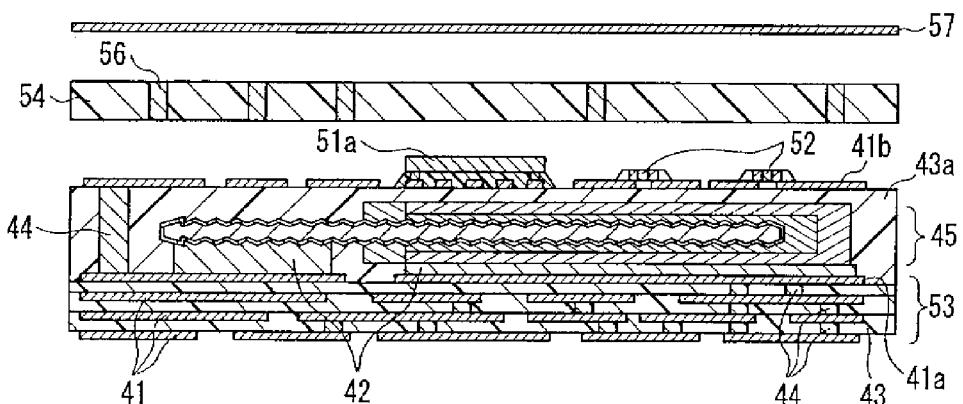
Figure 11C:
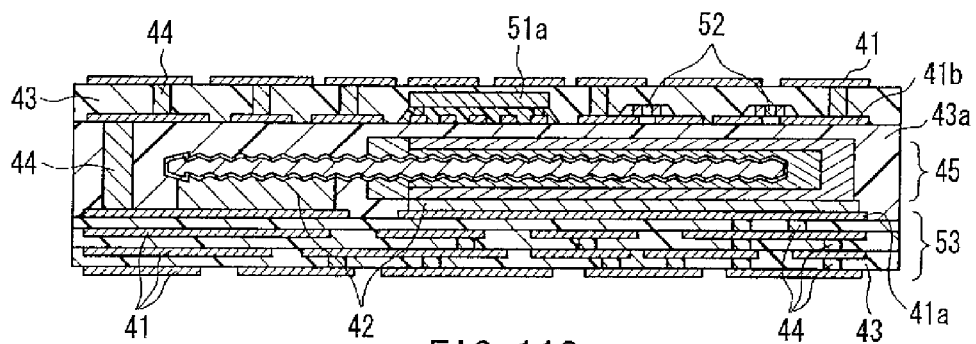

A method for producing a module incorporating a capacitor shown in FIG. 10 is described with reference to FIGS. 11A to D. The following three components are prepared in advance. First, as shown in FIG. 11A, a first circuit board 53a is prepared in which four wiring layers 41 including a first wiring layer 41a exposed on the surface are formed. Second, a conductive adhesive containing a conductive filler and an uncured thermosetting resin is prepared. Third, two sheet-like electrically insulating substrates 54 containing an uncured thermosetting resin composition and an insulating filler are prepared. Additionally, as shown in FIG. 11B, the electrically insulating substrates 54 are provided with a through hole in advance, and a via paste 56 is filled into the through hole.

Next, the conductive adhesive is applied onto a predetermined area of the first wiring layer 41a formed on the surface of the circuit board 53. Then, the electrolytic capacitor component 45 is transported onto the first circuit board 53 with a magnetic action, followed by curing the conductive adhesive by heat treatment, forming a conductive adhesive portion 42. Next, the electrically insulating substrate 54 and a conductive foil 57 are laminated on the side of the circuit board 53 onto which the electrolytic capacitor component 45 is mounted, while performing heating and pressing at the same time, forming an electrically insulating layer 43 a. Next, a second wiring layer 41b is formed by patterning the conductive foil 57.

Figure 11D:
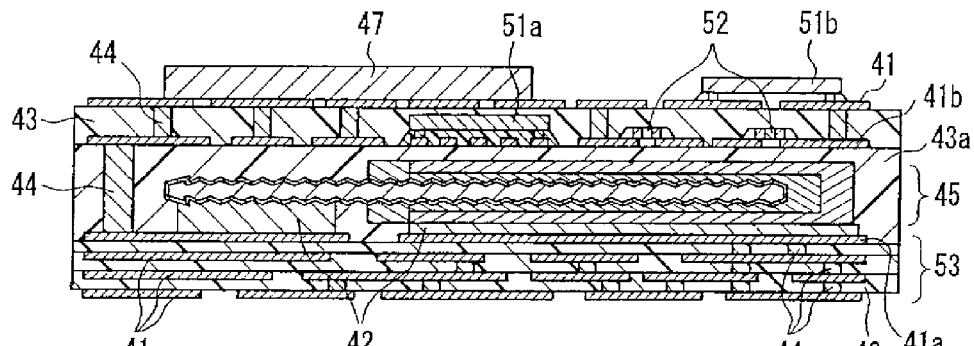
Figure 12:
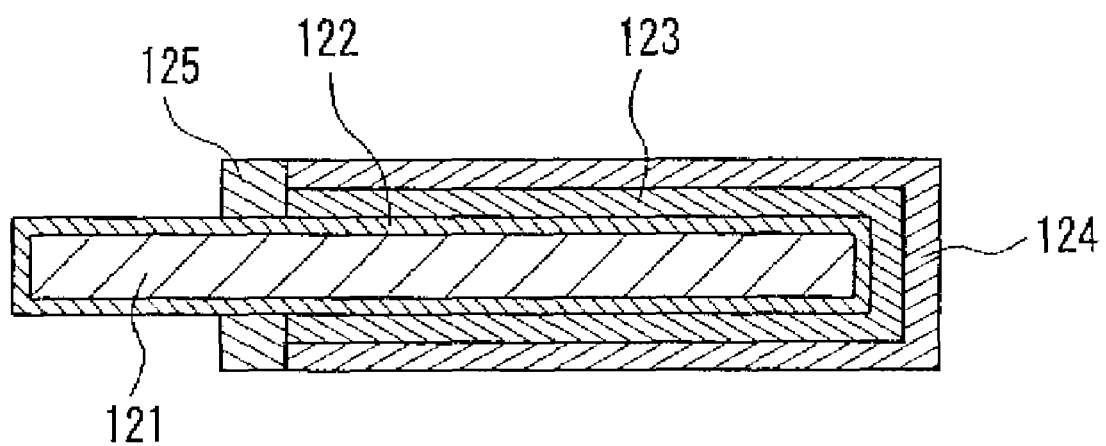
FIG. 12 is a schematic cross-sectional view showing a conventional solid electrolytic capacitor.

Then, as shown in FIG. 11A, the first semiconductor component 51a and the two bare chip semiconductor components 52 are mounted onto the second wiring layer 41b. Next, the electrically insulating substrate 54 and the conductive foil 57 are laminated as shown in FIG. 11B on the side of the circuit board 53 onto which the first semiconductor component 61a and the two bare chip semiconductor components 52 are mounted, while performing heating and pressing at the same time. Then, a wiring layer 41 is formed by patterning the conductive foil exposed on the surface. This completes the formation of the module incorporating a capacitor shown in FIG. 11C. Next, as shown in FIG. 11D, the second semiconductor component 51b and the inductor component 47 are mounted onto the surface of the module incorporating a capacitor. By performing these steps, it is possible to produce the module incorporating a capacitor shown in FIG. 10.

At the time of mounting the semiconductor components to be included in the module incorporating a capacitor, it is preferable that the semiconductor components are flip-chip mounted so as to be electrically connected to the wiring layers, regardless of whether they are incorporated in the module incorporating a capacitor, or mounted on the surface of the module incorporating a capacitor. This is because when a semiconductor component is flip-chip mounted, the area required for the mounting and the height of the mounted semiconductor can be made smaller than when it is mounted by wire bonding. Accordingly the module incorporating a capacitor further can be increased in density and decreased in thickness. Furthermore, when the first semiconductor component 51a is flip-chip mounted, it is possible to suppress the flow of wire resulting from the deformation of the electrically insulating substrate, which may occur when it is mounted by wire bonding, in the step of laminating the electrically insulating substrate and performing heating and pressing after mounting the first semiconductor component 51a, resulting in a higher mount reliability.

According to this embodiment, it is possible to produce a module incorporating a capacitor having a specific electrical function, by incorporating a capacitor of the present invention and integrating the capacitor with semiconductor components and other capacitors. Examples of the specific electrical function resulting from integrating capacitors, semiconductor components and an inductor as in this embodiment include a DC-DC converter function. In general, as the capacitor and the inductor that form a DC-DC converter, it is necessary to use, respectively, a capacitor with a relatively large capacitance and an inductor with a relatively large inductance, as compared with those forming other modules incorporating a capacitor. Therefore, when the module incorporating a capacitor is a DC/DC converter module incorporating a capacitor, the use of the electrolytic capacitor component 45 of the present invention, which is a large-capacitance, thin, easy-to-handle component, produces a particularly high effect in reducing the size and thickness of the module.

FIG. 10 shows semiconductor components (the first semiconductor component 11a and the bare chip components 52) incorporated in the module incorporating a capacitor and a semiconductor component (the second semiconductor component 51b) mounted on the surface of the module incorporating a capacitor. However, the present invention is not limited to this configuration, and may include only the semiconductor component mounted on the surface of the module incorporating a capacitor, or may include only the semiconductor components incorporated in the module incorporating a capacitor Examples of the semiconductor components incorporated in the module incorporating a capacitor include a packaged semiconductor component and a bare chip semiconductor component, and it is preferable to use a bare chip semiconductor component. The reason is that the use of a bare chip semiconductor component can save the area required for packaging, and thus facilitates miniaturization of the module incorporating a capacitor. As the semiconductor component mounted on the surface of the module incorporating a capacitor, on the other hand, it is preferable to use a packaged semiconductor component. This is because the use of a packaged semiconductor component can reduce the damage caused by an external force, as well as the malfunction caused by an external electromagnetic action.

Although in FIG. 10 the inductor component 47 is not arranged directly above the electrolytic capacitor component 45, it is preferable to arrange the inductor component 47 directly above the electrolytic capacitor component 45 (see FIG. 9) as described in Embodiment 6 above, in order to increase the inductance of the inductor component 47. The module incorporating a capacitor of this embodiment may include, in place of the inductor component 47, a coil wiring formed by a portion of the multi-layered wiring group of a circuit incorporating a capacitor and a portion of the via contact group embedded in the electrically insulating portion of the circuit incorporating a capacitor. Further, the module incorporating a capacitor of this embodiment may include both the inductor component 47 and wiring forming a coil. In the case of forming the wiring forming a coil as the inductor, it is preferable to form the wiring such that the electrolytic capacitor component 45 serves as the magnetic core of the coil as described in Embodiments 5 an 6 above, in order to increase the inductance of the coil.

Example 1

Example 1 of the present invention is a working example of the electrolytic capacitor component described in Embodiment 2 above. A solid electrolytic capacitor of the present example includes a foil-type ferromagnetic portion with an adhesive portion as the ferromagnetic portion, and has a configuration similar to that of the electrolytic capacitor component shown in FIG. 3.

First, an aluminum foil with a thickness of 100 μm was prepared as an anode valve metal, and the surface of the foil was roughened by electrolytic etching. The surface roughening was performed by applying an alternating current to the aluminum foil in an electrolyte containing hydrochloric acid as the main component at a concentration of 10 mass %, at a liquid temperature of 35° C. The roughened layer formed by the surface roughening had a thickness of about 40 mm. Then, the aluminum foil was cut into a 3 mm square region. The cut region was used as a capacitance forming portion.

Next, the aluminum foil was subjected to constant voltage formation at a forming voltage of 8 V in a 5 mass % ammonium adipate aqueous solution whose liquid temperature was maintained at 60° C., forming a dielectric oxide film with a thickness of 7 nm on the surface of the anode valve metal. Next, the capacitance forming portion of the anode valve metal was immersed in a solution containing a polythiophene monomer, an iron-based oxidant and a dopant, and a solid electrolyte was formed by chemical polymerization of the polythiophene monomer. Next, the dielectric oxide film was repaired by performing anodic oxidation again in an organic-solvent-based electrolyte.

Next, a polyimide tape with a width of 0.5 mm was attached as an insulator to the boundary between the capacitance forming portion and the electrode lead portion of the anode valve metal, separating the anode portion and the cathode portion. Then, a carbon layer was formed by applying a carbon paste to the solid electrolyte, followed by heat treatment. Furthermore, an Ag layer was formed by applying an Ag paste to the surface of the carbon layer, followed by drying, thereby forming a cathode current collector made up of the carbon layer and the Ag layer Next, a self-adhesive iron foil (manufactured by Sekisui Chemical Co., Ltd.) with a thickness of 25 μm was punched into a T-shape, and attached to one side of the cathode current collector. This formed a ferromagnetic portion (foil-type ferromagnetic portion with an adhesive) on the current collector.

Finally, the electrode lead portion of the anode valve metal was formed by punching with a punching die, thereby forming a solid electrolytic capacitor component (hereinafter, referred to as "solid electrolytic capacitor component of Example 1) having outer dimensions of 3 mm×5 mm and a thickness of about 0.2 mm in a configuration similar to that of the electrolytic capacitor component shown in FIG. 3.

For comparison, a solid electrolytic capacitor component (hereinafter, referred to as "solid electrolytic capacitor component of Comparative Example 1) was produced in the same manner as the solid electrolytic capacitor component of Example 1, except that the self-adhesive iron foil was not attached.

When the solid electrolytic capacitor component of Comparative Example 1 was held by a chip component mounter (trademark "Panasert" manufactured by Matsushita Electric Industrial Co., Ltd.) using air suction, the component could not be held by the mounter and fell after about 30 seconds. In contrast, when the solid electrolytic capacitor component of Example 1 was attracted by a mounter using an electromagnet by a magnetic action, the electrolytic capacitor component did not fall and remained held for a period during which a magnetic field was exerted by the electromagnet. It should be noted that the strength of the magnetic field was about 7900 A/m (about 100 Oe (oersted)), and the magnetic field was exerted for five minutes. This proved that the use of the present example is effective especially for holding and transporting a profile component such as a solid electrolytic capacitor component.

Example 2

Example 2 of the present invention is a working example of the electrolytic capacitor component described in Embodiment 2 above. A solid electrolytic capacitor of the present example includes a particle-dispersed ferromagnetic portion as the ferromagnetic portion, and has a configuration similar to that of the electrolytic capacitor component shown in FIG. 3.

First, a paste mixture containing ferromagnetic particles was prepared by mixing 90 mass % of a powder of sendust (an alloy consisting of 5 mass % Al, 10 mass % Si and the remainder Fe) having an average particle size of 30 μm and serving as the ferromagnetic particles and 8 mass % of epoxy resin ("Epikote 828", manufactured by Japan Epoxy Resins Co., Ltd.) and 2 mass % of a curing agent ("PN-23", manufactured by Ajinomoto Fine-Techno Co., Inc) with three rolls.

The procedure of Example 1 was followed until after forming a cathode current collector, and then the paste mixture was printed by screen printing on the cathode current collector in a C-shape as shown in FIG. 2C. Thereafter, the epoxy resin contained in the above-described ferromagnetic material in paste form was cured by heating at 120° C. for one hour, forming a ferromagnetic portion (particle-dispersed ferromagnetic portion) with a thickness of about 30 μm on the cathode current collector. Then, the electrode lead portion of the anode valve metal was formed by punching with a punching die, thereby forming a solid electrolytic capacitor component having outer dimensions of 3 mm×5 mm and a thickness of about 0.2 mm in a configuration similar to that of the electrolytic capacitor component shown in FIG. 3.

When the solid electrolytic capacitor component of the present example was attracted by a mounter using an electromagnet with a magnetic action in the same manner as in Example 1, the electrolytic capacitor component did not fall and remained held for a period during which a magnetic field was exerted by the electromagnet. It should be noted that the magnetic field was exerted for five minutes. This proved that the use of the present example is effective for holding and transporting a profile component such as a solid electrolytic capacitor component.

Example 3

Example 3 of the present invention is a working example of the electrolytic capacitor component described in Embodiment 3 above. A solid electrolytic capacitor component of the present example includes a ferromagnetic current collector serving as both the cathode current collector and the ferromagnetic portion, and has a configuration similar to that of the electrolytic capacitor component shown in FIG. 2A.

First, a paste mixture was prepared by mixing 40 mass % of an Ag powder, 45 mass % of a powder of permalloy (alloy consisting of 45 mass % Ni and the remainder Fe) serving as the ferromagnetic particles and 15 mass % of an epoxy resin (including a curing agent) with three rolls. It should be noted that this paste mixture is the material that forms the ferromagnetic current collector, which serves both as the cathode current collector and the ferromagnetic portion in the solid electrolytic capacitor.

The procedure of Example 1 was followed to perform the surface roughening of aluminum, the formation of a dielectric oxide film, the formation of a solid electrolyte, the electrical insulation between the anode portion and the cathode portion with a polyimide tape and the formation of a carbon layer. Next, a cathode ferromagnetic current collector was formed by applying a paste mixture formed in advance onto the carbon layer, followed by curing the paste mixture by heating. Thereafter, the electrode lead portion of the anode valve metal was formed by punching with a punching die, thereby forming a solid electrolytic capacitor component having outer dimensions of 3 mm×5 mm and a thickness of about 0.2 mm in a configuration similar to that of the electrolytic capacitor component shown in FIG. 4.

When the solid electrolytic capacitor component of the present example was held by a mounter using an electromagnet in the same manner as in Example 1, the electrolytic capacitor component did not fall and remained held for a period (five minutes) in which an magnetic field was applied by the electromagnet. This proved that the use of the present example is effective for holding and transporting a profile component such as a solid electrolytic capacitor component.

Example 4

Example 4 of the present invention is a working example of the module incorporating a capacitor described in Embodiment 4 above. A circuit board incorporating a capacitor component of the present example has a configuration similar to that of the module incorporating a capacitor shown in FIGS. 5A and B. It should be noted that reference is also made to FIGS. 6A to C, as necessary.

In order to produce a module incorporating an electrolytic capacitor, a first multi-layered epoxy board, a second epoxy board, an electrically insulating substrate and a conductive adhesive were prepared in advance.

First, a first multi-layered glass epoxy board and a second multi-layered glass epoxy board were prepared. In the first multi-layered glass epoxy board, a wiring layer is formed so as to have a wiring pattern corresponding to the electrodes of the electrolytic capacitor, and wiring layers with a predetermined wiring pattern and via contacts with a predetermined pattern were formed so as to form a coil whose central axis was in the plane direction of the board. In the second multi-layered glass epoxy board, wiring layers with a predetermined wiring pattern and via contacts with a predetermined pattern were formed so as to form a coil whose central axis was in the plane direction of the board. Here, the two multi-layered glass epoxy boards had configurations similar respectively to the circuit boards 53a and 53b shown in FIG. 6B.

An electrically insulating substrate was produced as follows. A solid component in which 81 mass % of a fused silica powder, 19 mass % of an epoxy resin (including a curing agent) and MEK as a solvent were mixed with a planetary mixer. The mixing ratio (mass ratio) of the solid component to the solvent was 10 to 1. A mixture film was formed by applying the obtained mixture onto a PET carrier film by doctor blading. Next, a thermosetting sheet member with a thickness of 200 μm was formed by vaporizing the MEK contained in the mixture film. Then, a through hole with a diameter of 0.2 mm was formed in a predetermined position of the thermosetting sheet member with a punching machine. Subsequently, a via paste was filled into the through hole formed in the thermosetting sheet member by a printing process, forming an electrically insulating substrate. In this electrically insulating substrate, a via paste, which later served as a component of the coil, was formed in a predetermined pattern. The via paste used was produced by mixing 87 mass % of a copper powder and 13 mass % of an epoxy resin (including a curing agent) with three rolls.

Furthermore, a conductive adhesive was produced by mixing 82 mass % of a silver powder and 18 mass % of an epoxy resin with three rolls.

The conductive adhesive was printed on the surface of the wiring layer of the first multi-layered glass epoxy board using a metal mask, and thereafter the solid electrolytic capacitor component of Example 1 was placed on the printed conductive adhesive, followed by heating at 120° C. for 15 minutes. Thus, the solid electrolytic capacitor component of Example 1 was mounted onto the first multi-layered glass epoxy board.

Next, the electrically insulating substrate and the second glass epoxy board were laminated on the first multi-layered glass epoxy board on which the electrolytic capacitor component was mounted, and all of these components were integrated by heating and pressing at a temperature 180° C. under a pressure of 1 MPa. This formed a circuit board incorporating a capacitor with a configuration similar to the module incorporating a capacitor shown in FIG. 6C. Ten such circuit boards were produced.

In the circuit board incorporating a capacitor of the present example, a 10-turn coil (whose number of turns was 10) was formed. This coil was made up of the wiring layers and the via contacts in the first multi-layered glass epoxy board, the wiring layers and the via contacts in the second multi-layered glass epoxy board, and the via contacts in the electrically insulating layer. Further, the solid electrolytic capacitor component was disposed at the core of the coil. It should be noted that the coil (the coil wiring 41c of A1 to A16) formed in the module incorporating a capacitor shown in FIGS. 5A and B is an 8-turn coil, which has a number of turns different from that of the coil of present example.

While the solid electrolytic capacitor component of Example 1 was incorporated in the circuit board incorporating a capacitor of the present example, a circuit board incorporating a capacitor for comparison was produced in the same manner as in Example 1, except that the solid electrolytic capacitor component of Comparative example 1 was used in place of the solid electrolytic capacitor component of Example 1.

The magnetic permeability of the portion forming the coil was measured for the circuit board incorporating a capacitor of the present example and the circuit board incorporating a capacitor of the comparative example, using a BH analyzer (model number: SY-8232, manufactured by IWATSU TEST INSTRUMENTS CORPORATION). The relative permeability measured at 100 kHz (with the permeability in vacuum taken as 1.0) was 10 when the electrolytic capacitor component of the present example was incorporated, whereas it was about 1 when the electrolytic capacitor component of the comparative example was incorporated. This indicated that the inductance of the coil is higher when the electrolytic capacitor component of the present example was disposed in the coil, than when the conventional electrolytic capacitor component was disposed.

The present invention can be applied to capacitors. In particular, the present invention suitably can be applied to electrolytic capacitor components. Furthermore, the present invention can be applied to various semiconductor devices and the modules incorporating a capacitor used in the semiconductor devices.

The invention may be embodied in other forms without departing from the spirit or essential characteristics thereof. The embodiments a disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A module incorporating a capacitor, the module comprising a circuit board and a layer incorporating the capacitor,
    wherein the circuit board includes a wiring layer and a via contact for providing electrical conductivity to a cathode and an anode of the capacitor,
    wherein the layer incorporating the capacitor is formed of an inorganic filler and a cured thermosetting resin composition, and includes a ferromagnetic layer integrated with at least a portion of a surface of the capacitor, and
    wherein, in the circuit board or the layer incorporating the capacitor, a coil is wound around the capacitor, or an inductor component is disposed in parallel with the capacitor,
    wherein the coil is wound around the capacitor and is a transverse coil formed by wirings on a surface of the circuit board or the layer incorporating the capacitor, and the ferromagnetic layer serves as a magnetic core of the coil.

2. The module incorporating a capacitor according to claim 1,
    wherein a magnetic force diffused from the inductor component is returned to the inductor component with the ferromagnetic layer by disposing the ferromagnetic layer at least on the inductor component side when the capacitor and the inductor component are disposed in parallel.

3. The module incorporating a capacitor according to claim 1,
    wherein the capacitor is an electrolytic capacitor comprising: a valve metal including a capacitance forming portion and an electrode lead portion; a dielectric oxide film disposed on a surface of the valve metal; a solid electrolyte disposed on a surface of the capacitance forming portion, with the dielectric oxide film interposed between the solid electrolyte and the capacitance forming portion; and a current collector that is disposed on a surface of the solid electrolyte and is electrically insulated from the valve metal, and
    wherein the ferromagnetic layer is disposed on the current collector.

4. The module incorporating a capacitor according to claim 1,
    wherein the ferromagnetic layer is a ferromagnetic foil bonded onto the capacitor.

5. The module incorporating a capacitor according to claim 1,
    wherein the ferromagnetic layer is formed of a mixture containing ferromagnetic particles and a resin.

6. The module incorporating a capacitor according to claim 5,
    wherein the resin is a thermosetting resin.

7. The module incorporating a capacitor according to claim 5,
    wherein the mixture containing the ferromagnetic particles and the resin is exposed on a surface of the capacitor.

8. The module incorporating a capacitor according to claim 1,
    wherein the capacitor is an electrolytic capacitor comprising: a valve metal including a capacitance forming portion and an electrode lead portion; a dielectric oxide film disposed on a surface of the valve metal; a solid electrolyte disposed on a surface of the capacitance forming portion, with the dielectric oxide film interposed between the solid electrolyte and the capacitance forming portion; and a current collector that is disposed on a surface of the solid electrolyte and is electrically insulated from the valve metal, and
    wherein the current collector is formed of the mixture containing the ferromagnetic particles and the resin.

9. The module incorporating a capacitor according to claim 1,
    wherein a surface of the ferromagnetic layer that is not in contact with the capacitor has a shape of a concave polygon.

10. The module incorporating a capacitor according to claim 9,
    wherein the concave polygon is a cross-shape, a T-shape or a U-shape.

11. The module incorporating a capacitor according to claim 1.
    wherein the wiring layer of the circuit board and the electrodes of the capacitor are electrically connected via a conductive adhesive containing a conductive powder and a thermosetting resin.

* * * * *